(12) United States Patent
Ueda et al.

(10) Patent No.: US 12,352,830 B2
(45) Date of Patent: *Jul. 8, 2025

(54) SENSOR UNIT

(71) Applicant: TDK CORPORATION, Tokyo (JP)

(72) Inventors: Kunihiro Ueda, Tokyo (JP);
Yoshimitsu Wada, Tokyo (JP); Hiraku Hirabayashi, Tokyo (JP); Kazuma Yamawaki, Tokyo (JP); Tsuyoshi Umehara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/607,811

(22) Filed: Mar. 18, 2024

(65) Prior Publication Data

US 2024/0219484 A1  Jul. 4, 2024

Related U.S. Application Data

(63) Continuation of application No. 18/180,369, filed on Mar. 8, 2023, now Pat. No. 11,959,979, which is a
(Continued)

(30) Foreign Application Priority Data

| Jul. 5, 2016 | (JP) | 2016-140085 |
| Dec. 13, 2016 | (JP) | 2016-241461 |
| Jan. 6, 2017 | (JP) | 2017-000854 |

(51) Int. Cl.
*G01R 33/00* (2006.01)
*B82Y 10/00* (2011.01)
(Continued)

(52) U.S. Cl.
CPC .......... *G01R 33/0005* (2013.01); *B82Y 10/00* (2013.01); *B82Y 25/00* (2013.01);
(Continued)

(58) Field of Classification Search
CPC ........... G01R 33/0005; G01R 33/0094; G01R 33/09; G01R 33/091; G01R 33/093;
(Continued)

(56) References Cited

U.S. PATENT DOCUMENTS

| 9,529,013 B2 | 12/2016 | Racz et al. |
| 9,982,989 B2 | 5/2018 | Ausserlechner |

(Continued)

FOREIGN PATENT DOCUMENTS

| CN | 1517706 A | 8/2004 |
| CN | 202285038 U | 6/2012 |

(Continued)

OTHER PUBLICATIONS

CN 204287112 machine translation, Apr. 22, 2015.
CN 202285038 machine translation, Jun. 27, 2012.

*Primary Examiner* — Raul J Rios Russo
(74) *Attorney, Agent, or Firm* — Oliff PLC

(57) ABSTRACT

This sensor unit includes a base having a substantially-rectangular planar shape including a first side and a second side that are substantially orthogonal to each other, and a plurality of first sensors provided on the base and arranged on a first axis. The first axis is substantially parallel to the first side and passes through a center position of the base.

5 Claims, 32 Drawing Sheets

Related U.S. Application Data continuation of application No. 17/703,495, filed on Mar. 24, 2022, now Pat. No. 11,630,165, which is a continuation of application No. 16/816,685, filed on Mar. 12, 2020, now Pat. No. 11,313,920, which is a continuation of application No. 15/641,529, filed on Jul. 5, 2017, now Pat. No. 10,634,734.

(51) Int. Cl.
| | | |
|---|---|---|
| *B82Y 25/00* | (2011.01) | |
| *B82Y 40/00* | (2011.01) | |
| *G01R 15/20* | (2006.01) | |
| *G01R 33/07* | (2006.01) | |
| *G01R 33/09* | (2006.01) | |

(52) U.S. Cl.
CPC .......... *B82Y 40/00* (2013.01); *G01R 33/0094* (2013.01); *G01R 33/09* (2013.01); *G01R 33/091* (2013.01); *G01R 33/093* (2013.01); *G01R 33/096* (2013.01); *G01R 33/098* (2013.01); *G01R 15/205* (2013.01); *G01R 33/0082* (2013.01); *G01R 33/07* (2013.01)

(58) Field of Classification Search
CPC .. G01R 33/096; G01R 33/098; G01R 15/205; G01R 33/0082; G01R 33/07; B82Y 10/00; B82Y 25/00; B82Y 40/00
USPC ........................................................ 324/252
See application file for complete search history.

(56) References Cited

U.S. PATENT DOCUMENTS

| | | | |
|---|---|---|---|
| 10,309,802 | B2 | 6/2019 | Ausserlechner |
| 2002/0021124 | A1 | 2/2002 | Schott et al. |
| 2004/0074685 | A1 | 4/2004 | Tham |
| 2004/0150296 | A1 | 8/2004 | Park et al. |
| 2006/0061350 | A1 | 3/2006 | Myers et al. |
| 2007/0284684 | A1* | 12/2007 | Naito .................. H01L 24/13 257/E43.001 |
| 2011/0194343 | A1* | 8/2011 | Gao .................. G11C 11/1675 365/171 |
| 2012/0039115 | A1* | 2/2012 | Zheng .................. H01F 10/329 365/158 |
| 2012/0279077 | A1 | 11/2012 | Withanawasam et al. |
| 2013/0234734 | A1 | 9/2013 | Iida et al. |
| 2014/0062470 | A1* | 3/2014 | Lai .................. G01R 33/0005 324/252 |
| 2014/0097835 | A1 | 4/2014 | Sartee et al. |
| 2015/0022192 | A1 | 1/2015 | Ausserlechner |
| 2015/0194413 | A1 | 7/2015 | Lee et al. |
| 2015/0274504 | A1 | 10/2015 | Kitai et al. |
| 2018/0017634 | A1 | 1/2018 | Ueda et al. |
| 2018/0038896 | A1 | 2/2018 | Sakaguchi |
| 2018/0232554 | A1 | 8/2018 | Benkley, III et al. |
| 2019/0293734 | A1 | 9/2019 | Watanabe et al. |
| 2020/0202082 | A1 | 6/2020 | Alaoui et al. |
| 2020/0300667 | A1 | 9/2020 | Takano et al. |
| 2021/0055132 | A1* | 2/2021 | Bondar .................. H10N 52/00 |
| 2021/0063204 | A1* | 3/2021 | Bondar .................. G01R 33/072 |
| 2021/0247465 | A1 | 8/2021 | Takano et al. |
| 2021/0372821 | A1 | 12/2021 | Schmitt et al. |
| 2022/0026507 | A1 | 1/2022 | Makino |
| 2022/0196378 | A1 | 6/2022 | Osabe et al. |

FOREIGN PATENT DOCUMENTS

| | | |
|---|---|---|
| CN | 204287112 U | 4/2015 |
| DE | 102004047784 A1 | 4/2006 |
| DE | 102014109950 A1 | 1/2015 |
| JP | H06-042906 A | 2/1994 |
| JP | 2004-520592 A | 7/2004 |
| JP | 2006-100348 A | 4/2006 |
| JP | 2006-208255 A | 8/2006 |
| JP | 2009-63385 A | 3/2009 |
| JP | 2012-119613 A | 6/2012 |
| JP | 2014-174170 A | 9/2014 |
| WO | 2006037695 A1 | 4/2006 |

* cited by examiner

SENSOR UNIT

CROSS-REFERENCE TO RELATED APPLICATION(S)

This application is a continuation of U.S. application Ser. No. 18/180,369 filed Mar. 8, 2023, which is a continuation of U.S. application Ser. No. 17/703,495 filed Mar. 24, 2022, which is a continuation of U.S. patent application Ser. No. 16/816,685 filed Mar. 12, 2020, which is a continuation of Ser. No. 15/641,529 filed Jul. 5, 2017, which is based on and claims priority under 35 U.S.C. 119 from Japanese Patent Application No. 2016-140085 filed on Jul. 15, 2016, Japanese Patent Application No. 2016-241461 filed on Dec. 13, 2016 and Japanese Patent Application No. 2017-000854 filed on Jan. 6, 2017. The contents of the above applications are incorporated herein by reference.

BACKGROUND

The invention relates to a sensor unit in which a plurality of sensors are disposed on a base.

In general, a sensor unit (a sensor package) has been known in which a plurality of sensors, an integrated circuit, and so forth are provided on a base (for example, see Japanese Unexamined Patent Application Publication No. 2009-63385). As such a sensor package, an angle detection sensor has been proposed that detects a rotary operation of a rotating body such as an axle (for example, see Japanese Unexamined Patent Application Publication No. 2006-208255).

SUMMARY

Incidentally, miniaturization and an improvement in detection accuracy of such a sensor unit have been strongly desired in recent years.

However, with a progress in size reduction, stress due to a distortion of a base resulting from a change in environmental temperature, heat generation of an integrated circuit, and so forth is applied to each sensor, which in turn may possibly cause an adverse effect on an output of each of the sensors.

It is therefore desirable to provide a sensor unit in which a decrease in detection accuracy due to a factor such as thermal stress is small and thus having superior reliability.

A first sensor unit according to one embodiment of the invention includes: a base having a substantially-rectangular planar shape including a first side and a second side that are substantially orthogonal to each other; and a plurality of first sensors provided on the base and arranged on a first axis. The first axis is substantially parallel to the first side and passes through a center position of the base.

In the first sensor unit according to one embodiment of the invention, the plurality of first sensors are arranged on the first axis. The first axis on the base is substantially parallel to the first side and passes through the center position of the base. Thus, the plurality of first sensors are placed at respective positions in which a distortion of the base is relatively small.

The first sensor unit according to one embodiment of the invention may further include a plurality of leads each having one end provided on the base, and arranged along the first side or the second side, or arranged along both of the first side and the second side. In this case, the plurality of leads may be arranged along the first side. Moreover, a plurality of second sensors may be further included that are provided on the base and arranged on a second axis, in which the second axis is substantially parallel to the second side and passes through the center position of the base. In this case, one of the first sensors and one of the second sensors each may be a center position sensor provided at the center position of the base, the same number of the remaining first sensors, excluding the center position sensor, of the first sensors may be provided on either side of the center position sensor to interpose the center position sensor, and the same number of the remaining second sensors, excluding the center position sensor, of the second sensors may be provided on either side of the center position sensor to interpose the center position sensor. In addition, the first sensors may be disposed on the first axis with a first distance provided therebetween that separates the first sensors mutually, and the second sensors may be disposed on the second axis with a second distance provided therebetween that separates the second sensors mutually. In this case, desirably, the first distance and the second distance may be substantially equal to each other.

In the first sensor unit according to one embodiment of the invention, one of the first sensors may be a center position sensor provided at the center position of the base, and the same number of the remaining first sensors, excluding the center position sensor, of the first sensors may be provided on either side of the center position sensor to interpose the center position sensor. The first sensors may be disposed, for example, on the first axis with a first distance provided therebetween that separates the first sensors mutually.

In the first sensor unit according to one embodiment of the invention, the first sensors may have respective planar shapes that are substantially equal to each other, sizes, along the first side, of the respective first sensors may be substantially same as each other, and sizes, along the second side, of the respective first sensors may be substantially same as each other. The first sensors may have substantially same configuration as each other.

In the first sensor unit according to one embodiment of the invention, the first sensors may have respective planar shapes that are substantially equal to each other, sizes, along the first side, of the respective first sensors may be substantially same as each other, sizes, along the second side, of the respective first sensors may be substantially same as each other, the second sensors may have respective planar shapes that are substantially equal to each other, sizes, along the first side, of the respective second sensors may be substantially same as each other, and sizes, along the second side, of the respective second sensors may be substantially same as each other. In this case, the sizes, along the first side, of the respective first sensors and the sizes, along the first side, of the respective second sensors may be substantially same as each other, and the sizes, along the second side, of the respective first sensors and the sizes, along the second side, of the respective second sensors may be substantially same as each other. The first sensors may have substantially same configuration as each other, and the second sensors may have substantially same configuration as each other. The configurations of the respective first sensors and the configurations of the respective second sensors may be substantially same as each other.

In the first sensor unit according to one embodiment of the invention, the first sensors and the second sensors each may include a magneto-resistive effect device. In addition, a length of the first side and a length of the second side may be substantially equal to each other. The base may have a substrate and a circuit chip stacked on the substrate, and a center position of the substrate may be coincident with a center position of the circuit chip.

A second sensor unit according to one embodiment of the invention includes a base including a sensor region and n-number of sensors (where n is an integer equal to or greater than 2). The sensor region has a ratio of a size in a second direction to a size in a first direction which is less than n, and has a substantially-rectangular planar shape. The n-number of sensors are arrayed in the sensor region in line in the second direction, and each have a substantially-rectangular planar shape.

In the second sensor unit according to one embodiment of the invention, the n-number of sensors are arrayed in the sensor region in line in the second direction. The sensor region has the ratio of the size in the second direction to the size in the first direction which is less than n, and has the substantially-rectangular planar shape. Thus, all of the n-number of sensors are placed at respective positions in which a distortion of the base is relatively small, as compared with a case where the n-number of sensors are placed in a sensor region in which a ratio of a size in the second direction to a size in the first direction is equal to or greater than n.

In the second sensor unit according to one embodiment of the invention, the n-number of sensors each may have a first sensor size in the first direction and a second sensor size in the second direction, and the first sensor size may be larger than the second sensor size. This case is preferable in that the planar shape of the sensor region in which the n-number of sensors are arrayed becomes closer to square. In addition, the n-number of sensors may be arrayed at substantially even intervals.

In the second sensor unit according to one embodiment of the invention, all of the n-number of sensors may have substantially the same planar shape as each other and may have substantially same occupancy area as each other.

In the second sensor unit according to one embodiment of the invention, a center position in the second direction of the base and a center position in the second direction of the sensor region may be coincident with each other.

In the second sensor unit according to one embodiment of the invention, all of the n-number of sensors may have substantially same configuration as each other. For example, the n-number of sensors each may include a magneto-resistive effect device.

In the second sensor unit according to one embodiment of the invention, the base may have a first base size in the first direction and a second base size in the second direction, in which the second base size is substantially equal to the first base size.

In the second sensor unit according to one embodiment of the invention, the base may have a substrate and a circuit chip stacked on the substrate, and a center position of the substrate may be coincident with a center position of the circuit chip.

The first sensor unit according to one embodiment of the invention mitigates stress applied to the first sensors due to a distortion of the base, making it possible to stabilize outputs of the first sensors. The second sensor unit according to one embodiment of the invention mitigates stress applied to the n-number of sensors due to a distortion of the base, making it possible to stabilize outputs of the n-number of sensors. Hence, it is possible to achieve high reliability.

It is to be noted that an effect of the invention is not limited thereto, and may be any of effects to be described below.

DETAILED DESCRIPTION

In the following, an embodiment of the invention is described in detail with reference to the drawings. Each drawing is schematic and is not necessarily drawn strictly. Configurations substantially the same in each drawing are denoted with the same reference signs, and any duplicative description is omitted or simplified. Note that the description is given in the following order.

1. First Embodiment and its Modification Examples

Examples of a sensor unit in which a center position of a base and a center position of an IC chip are brought into coincidence with each other.

2. Second Embodiment and its Modification Example

An example of a sensor unit in which the center position of the base and the center position of the IC chip are made different from each other.

3. First Experimental Example

4. Third Embodiment and its Modification Examples

Examples of another sensor unit in which the center position of the base and the center position of the IC chip are brought into coincidence with each other.

5. Fourth Embodiment and its Modification Example

An example of another sensor unit in which the center position of the base and the center position of the IC chip are made different from each other.

6. Second Experimental Example

7. Other Modification Examples

1. First Embodiment

[Configuration of Sensor Unit 1A]

Figure 1:
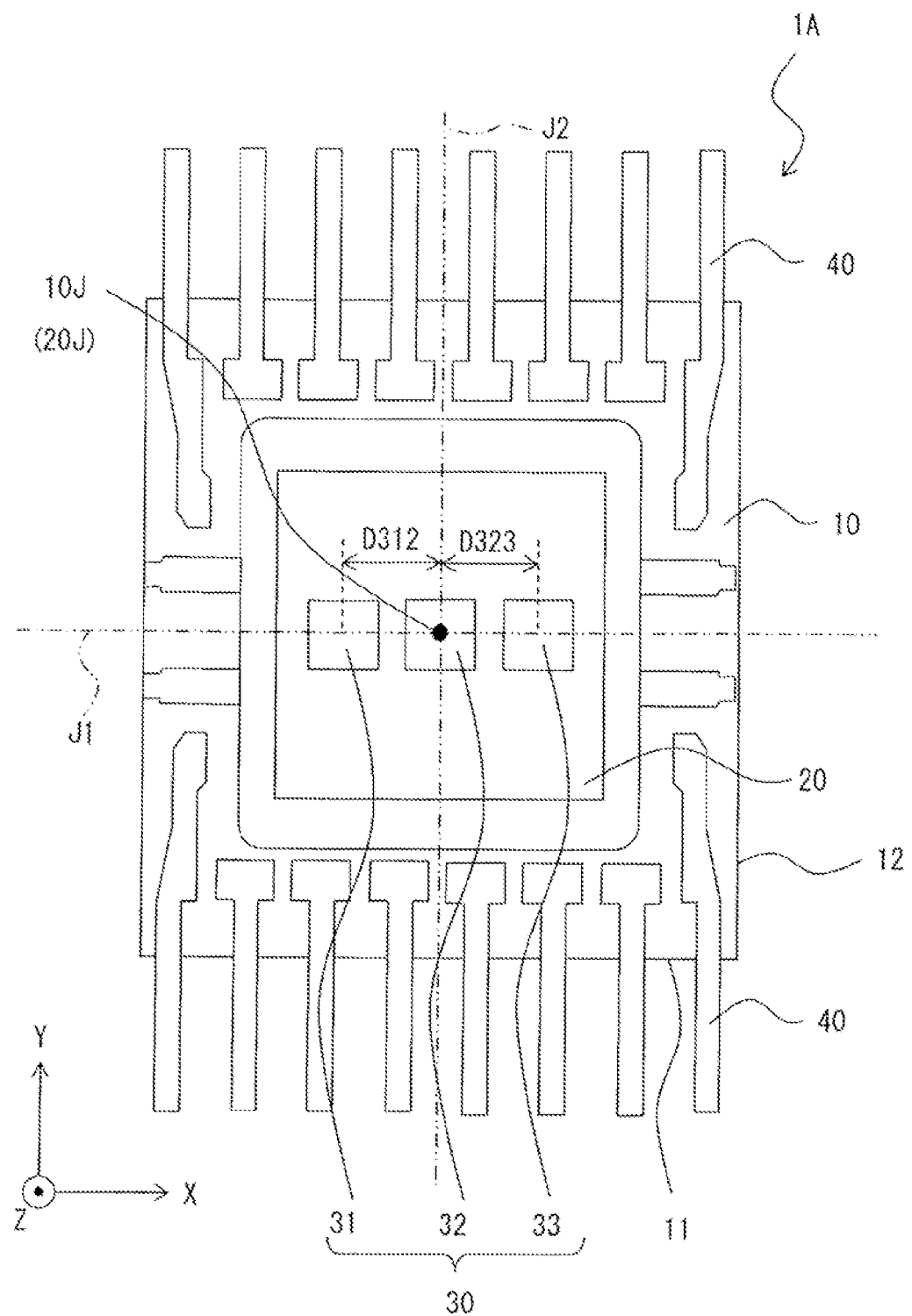
FIG. 1 is a plan view of an overall configuration of a sensor unit according to a first embodiment of the invention.
Figure 2:
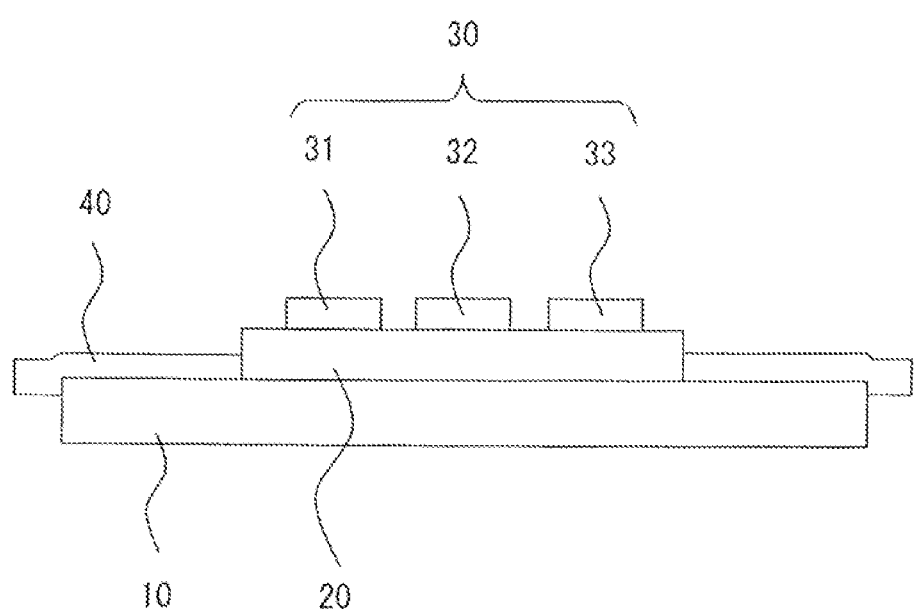
FIG. 2 is a cross-sectional view of a cross-sectional configuration of the sensor unit illustrated in FIG. 1.
Figure 3:
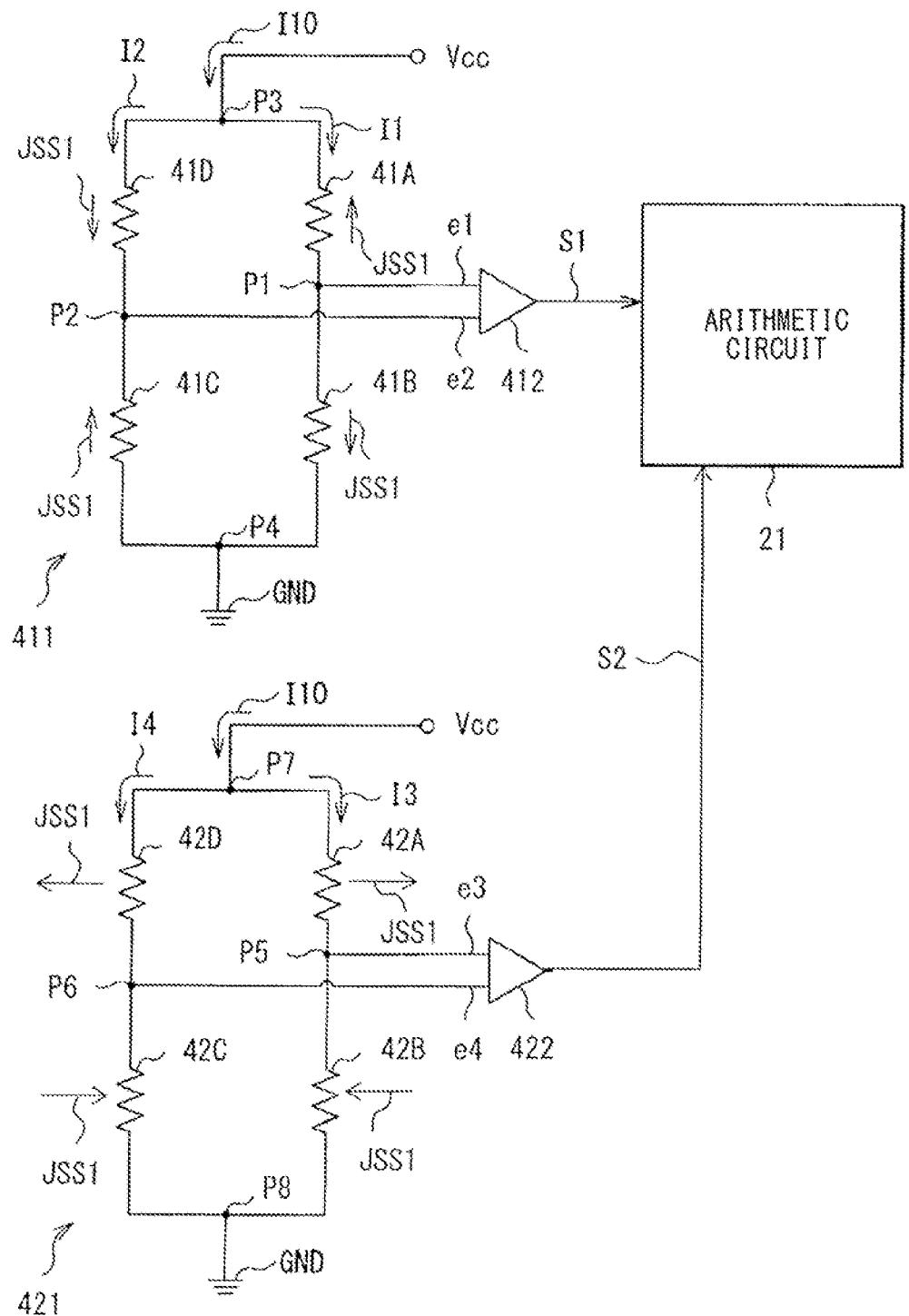
FIG. 3 is a circuit diagram of the sensor unit illustrated in FIG. 1.

First, a description is given, with reference to FIGS. 1 to 3, of a configuration of a sensor unit 1A according to a first embodiment of the invention. FIG. 1 is a plan view of an example of an overall configuration of the sensor unit 1A. FIG. 2 illustrates a cross-section of the sensor unit 1A taken along a first axis J1 illustrated in FIG. 1. FIG. 3 is a circuit diagram illustrating a schematic configuration of the sensor unit 1A. The sensor unit 1A is used as an angle detection sensor used for detection of a rotation angle of a rotating body, for example.

The sensor unit 1A includes a substrate 10, an integrated circuit (IC) chip 20 stacked on the substrate 10, a sensor group 30 stacked on the IC chip 20, and a plurality of leads 40. Note that a combination of the substrate 10 and the IC chip 20 is one specific example of a "base" according to the invention.

The substrate 10 has a substantially-rectangular planar shape including a first side 11 and a second side 12 that are substantially orthogonal to each other. Here, a length of the first side 11 and a length of the second side 12 may be substantially equal to each other and the planar shape of the substrate 10 may be substantially square. The term "substantially" means to tolerate a displacement of a level which results from a factor such as a manufacturing error. Note that, herein, a direction in which the first side 11 extends is defined as an X-axis direction, a direction in which the second side 12 extends is defined as a Y-axis direction, and a thickness direction of the substrate 10 (a direction perpendicular to the plane of drawing of FIG. 1) is defined as a Z-axis direction. Further, in FIG. 1, a center position of the substrate 10, i.e., an intersection of a second axis J2 that passes through a center position in the X-axis direction of the substrate 10 and a first axis J1 that passes through a center position in the Y-axis direction of the substrate 10, is denoted with a reference sign 10J. In the present embodiment, the plurality of leads 40 each have one end provided on the substrate 10, and are arranged along the first side 11.

The IC chip 20 has a rectangular planar shape, and has occupancy area that is smaller than the substrate 10. In the sensor unit 1A, a center position 20J of the IC chip 20, i.e., an intersection of a line that passes through a center position in the X-axis direction of the IC chip 20 and a line that passes through a center position in the Y-axis direction of the IC chip 20, is substantially coincident with the center position 10J of the substrate 10. Note that the wording "the center position 20J and the center position 10J are coincident with each other" means to tolerate a displacement in a range of about ±30 μm which results from a factor such as a manufacturing error. In addition, the IC chip 20 includes an arithmetic circuit 21 (see FIG. 3).

The sensor group 30 has sensors 31 to 33 arranged on the first axis J1 that passes through the center position 10J (20J) and that is parallel to an X axis, for example. The sensors 31 to 33 each have a rectangular planar shape, and each have occupancy area that is smaller than the IC chip 20. In addition, the sensor 32 is a center position sensor provided at the center position 10J (20J).

The sensors 31 to 33 are each rectangular in planar shape, and each have a size smaller than a size of the IC chip 20. The planar shape of each of the sensors 31 to 33 may be square. The sensors 31 to 33 include their respective magneto-resistive effect (MR) devices having configurations that are substantially the same as each other, for example. It is desirable that a distance D312 between the sensor 31 and the sensor 32 on the first axis J1 be substantially equal to a distance D323 between the sensor 32 and the sensor 33 on the first axis J1. Accordingly, the sensor 31 and the sensor 33 are so provided as to be symmetric with respect to a line and a point around the sensor 32 that serves as the center position sensor.

Figure 4:
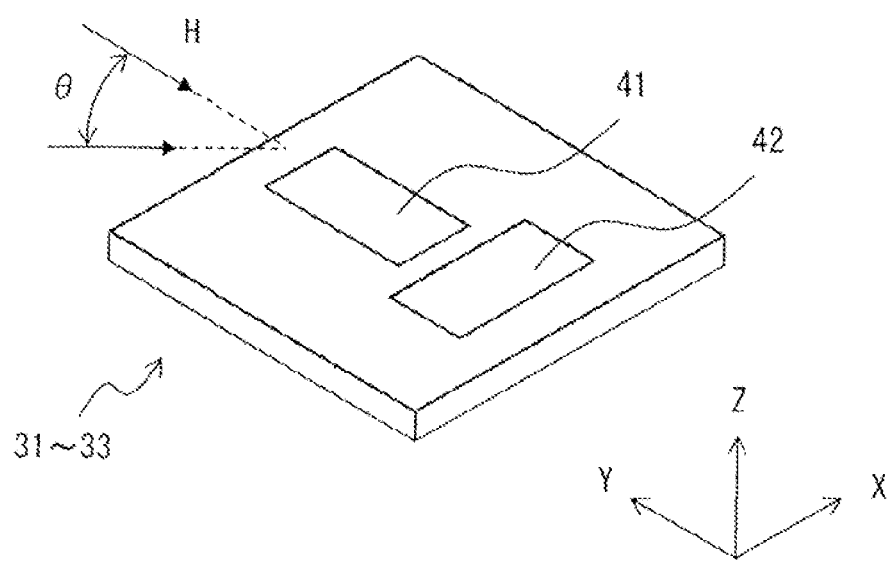
FIG. 4 is a perspective view of a configuration of a sensor illustrated in FIG. 1.
Figure 5:
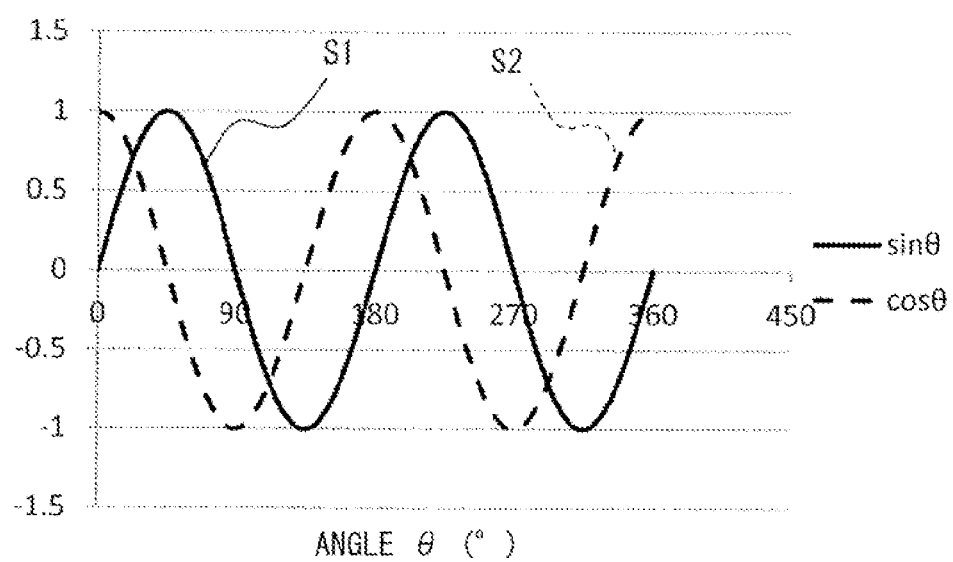
FIG. 5 is a characteristic diagram schematically illustrating changes in outputs of the sensor illustrated in FIG. 1.

The sensors 31 to 33 each have two sensor sections that output respective signals that are different in phase by, e.g., 90 degrees from each other with respect to a change (rotation) of an external magnetic field that serves as a detection target. Specifically, for example, the sensors 31 to 33 each have a magnetic sensor section 41 and a magnetic sensor section 42 as illustrated in FIG. 4. Note that FIG. 4 is a perspective view of a configuration of any of the sensors 31 to 33. The magnetic sensor section 41 detects a change (rotation) of an external magnetic field H, and outputs a differential signal S1 to the arithmetic circuit 21 (FIG. 3). Similarly, the magnetic sensor section 42 detects the change (rotation) of the external magnetic field H, and outputs a differential signal S2 to the arithmetic circuit 21 (FIG. 3). However, the phase of the differential signal S1 and the phase of the differential signal S2 are different from each other by 90 degrees. For example, where the differential signal S1 represents a change in output (for example, a resistance value) based on sine with respect to a rotation angle θ of the external magnetic field H, the differential signal S2 represents a change in output (for example, a resistance value) based on cos θ with respect to the rotation angle θ of the external magnetic field H as illustrated in FIG. 5. FIG. 5 is a characteristic diagram schematically illustrating the changes in outputs with respect to the rotation angle θ of the external magnetic field H.

As illustrated in FIG. 3, the magnetic sensor section 41 includes a bridge circuit 411 in which four magneto-resistive effect (MR: Magneto-Resistive effect) devices 41A to 41D are bridge-connected, and a difference detector 412. Similarly, the magnetic sensor section 42 includes a bridge circuit 421 in which four MR devices 42A to 42D are bridge-connected, and a difference detector 422. In the bridge circuit 411, one end of the MR device 41A and one end of the MR device 41B are coupled to each other at a node P1, one end of the MR device 41C and one end of the MR device 41D are coupled to each other at a node P2, the other end of the MR device 41A and the other end of the MR device 41D are coupled to each other at a node P3, and the other end of the MR device 41B and the other end of the MR device 41C are coupled to each other at a node P4. Here, the node P3 is coupled to a power source Vcc, and the node P4 is grounded. The nodes P1 and P2 are coupled to respective input terminals of the difference detector 412. The difference detector 412 detects a difference in electric potential between the node P1 and the node P2 upon application of a voltage between the node P3 and the node P4 (a difference between a voltage drop that occurs in the MR device 41A and a voltage drop that occurs in the MR device 41D), and outputs the difference to the arithmetic circuit 21 as the differential signal S1. Similarly, in the bridge circuit 421, one end of the MR device 42A and one end of the MR device 42B are coupled to each other at a node P5, one end of the MR device 42C and one end of the MR device 42D are coupled to each other at a node P6, the other end of the MR device 42A and the other end of the MR device 42D are coupled to each other at a node P7, and the other end of the MR device 42B and the other end of the MR device 42C are coupled to each other at a node P8. Here, the node P7 is coupled to the power source Vcc, and the node P8 is grounded. The nodes P5 and P6 are coupled to respective input terminals of the difference detector 422. The difference detector 422 detects a difference in electric potential between the node P5 and the node P6 upon application of a voltage between the node P7 and the node P8 (a difference between a voltage drop that occurs in the MR device 42A and a voltage drop that occurs in the MR device 42D), and outputs the difference to the arithmetic circuit 21 as the differential signal S2. Note that an arrow denoted by a reference sign JSS1 in FIG. 3 schematically indicates an orientation of magnetization of a magnetization pinned layer SS1 (to be described later) in each of the MR devices 41A to 41D and 42A to 42D. In other words, the arrows indicate that the resistance values of the respective MR devices 41A and 41C change in orientations that are same as each other (increase or decrease) in response to the change in the external magnetic field H, and that the resistance values of the respective MR devices 41B and 41D both change in orientations opposite to those of the MR devices 41A and 41C (decrease or increase) in response to the change in the external magnetic field H. Further, the change in the resistance value of each of the MR devices 42A and 42C is shifted in phase by 90 degrees from the change in the resistance value of each of the MR devices 41A to 41D in response to the change in the external magnetic field H. The resistance values of the respective MR devices 42B and 42D both change in orientations opposite to those of the MR devices 42A and 42C in response to the change in the external magnetic field H. Accordingly, for example, there is a relationship by which a behavior is exhibited in which the resistance values of the MR devices 41A and 41C increase whereas the resistance values of the MR devices 41B and 41D decrease within a certain angle range when the external magnetic field H rotates in a direction of θ (FIG. 4). At that time, the resistance values of the MR devices 42A and 42C change with their phase delayed (or leading) by, e.g., 90 degrees with respect to the change in the resistance values of the MR devices 41A and 41C, whereas the resistance values of the MR devices 42B and 42D change with their phase delayed (or leading) by 90 degrees with respect to the change in the resistance values of the MR devices 41B and 41D.

Figure 6:
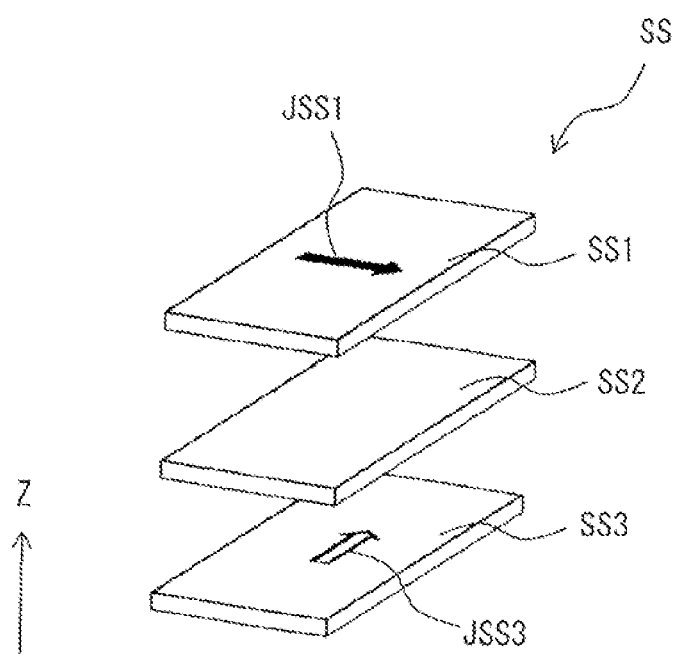
FIG. 6 is a schematic exploded perspective view of a major configuration of a magneto-resistive effect device illustrated in FIG. 3.

The MR devices 41A to 41D and 42A to 42D each have a spin-valve structure in which a plurality of functional films including a magnetic layer are stacked as illustrated in FIG. 6, for example. Specifically, the MR devices 41A to 41D and 42A to 42D each include the magnetization pinned layer SS1, an intermediate layer SS2, and a magnetization free layer SS3 that are stacked in order in the Z-axis direction. The magnetization pinned layer SS1 has the magnetization JSS1 pinned in a certain direction, the intermediate layer SS2 exhibits no magnetization in specific directions, and the magnetization free layer SS3 has a magnetization JSS3 that changes in accordance with a density of a magnetic flux of the external magnetic field H. The magnetization pinned layer SS1, the intermediate layer SS2, and the magnetization free layer SS3 are each a thin film that spreads in an X-Y plane. Accordingly, an orientation of the magnetization JSS3 of the magnetization free layer SS3 is rotatable in the X-Y plane. Note that FIG. 6 illustrates a load state in which the external magnetic field His given in the orientation of the magnetization JSS3. Further, the magnetization pinned layer SS1 in each of the MR devices 41A and 41C has the magnetization JSS1 pinned in a +X direction, for example, and the magnetization pinned layer SS1 in each of the MR devices 41B and 41D has the magnetization JSS1 pinned in a −X direction. Note that the magnetization pinned layer SS1, the intermediate layer SS2, and the magnetization free layer SS3 each may have either a single-layer structure or a multi-layer structure including a plurality of layers. Further, the magnetization pinned layer SS1, the intermediate layer SS2, and the magnetization free layer SS3 may be stacked in order reverse to that described above.

The magnetization pinned layer SS1 is made of a ferromagnetic material such as cobalt (Co), a cobalt-iron alloy (CoFe), and a cobalt-iron-boron alloy (CoFeB). Note that an antiferromagnetic layer (not illustrated) may be so provided on the opposite side of the intermediate layer SS2 as to be adjacent to the magnetization pinned layer SS1. Such an antiferromagnetic layer is made of an antiferromagnetic material such as a platinum-manganese alloy (PtMn) and an iridium-manganese alloy (IrMn). For example, in the magnetic sensor section 41, the antiferromagnetic layer is in a state in which a spin magnetic moment in the +X direction and a spin magnetic moment in the −X direction completely cancel each other, and serves to fix the orientation of the magnetization JSS1 of the adjacent magnetization pinned layer SS1 in the +X direction.

In a case where the spin-valve structure functions as a magnetic tunnel junction (MTJ: Magnetic Tunnel Junction) film, the intermediate layer SS2 is a non-magnetic tunnel barrier layer made of a magnesium oxide (MgO), for example, and has a thickness that is thin to the extent that a tunnel current based on quantum mechanics is able to pass therethrough. The tunnel barrier layer made of MgO is obtained by a process such as a process of oxidizing a thin film made of magnesium (Mg) and a reactive sputtering process in which sputtering of magnesium is performed under an oxygen atmosphere, besides a sputtering process that uses a target made of MgO, for example. It is also possible to configure the intermediate layer SS2 with use of an oxide or a nitride of each of aluminum (Al), tantalum (Ta), and hafnium (Hf), besides MgO. Note that the intermediate layer SS2 may be configured by an element of the platinum group such as ruthenium (Ru), or a non-magnetic metal such as copper (Cu) and gold (Au), for example. In this case, the spin-valve structure functions as a giant magneto resistive effect (GMR: Giant Magneto Resistive effect) film.

The magnetization free layer SS3 is a soft ferromagnetic layer, and configured by a cobalt-iron alloy (CoFe), a nickel-iron alloy (NiFe), a cobalt-iron-boron alloy (CoFeB), or the like, for example.

The MR devices 41A to 41D configuring the bridge circuit 411 are each supplied with a current I1 or a current I2 in each of which a current I10 supplied from the power source Vcc is divided at the node P3. Signals e1 and e2 outputted from the respective nodes P1 and P2 of the bridge circuit 411 are supplied into the difference detector 412. Here, where an angle between the magnetization JSS1 and the magnetization JSS3 is defined as $\gamma$, for example, the signal e1 represents an output change that changes in accordance with $A\cos(+\gamma)+B$, and the signal e2 represents an output change that changes in accordance with $A\cos(\gamma-180°)+B$ (A and B are each a constant).

On the other hand, the MR devices 42A to 42D configuring the bridge circuit 421 are each supplied with a current I3 or a current I4 in each of which the current I10 supplied from the power source Vcc is divided at the node P7. Signals e3 and e4 outputted from the respective nodes P5 and P6 of the bridge circuit 421 are supplied into the difference detector 422. Here, the signal e3 represents an output change that changes in accordance with $A\sin(+\gamma)+B$, and the signal e4 represents an output change that changes in accordance with $A\sin(\gamma-180°)+B$. Further, the differential signal S1 from the difference detector 412 and the differential signal S2 from the difference detector 422 are supplied into the arithmetic circuit 21. The arithmetic circuit 21 calculates an angle based on tan $\gamma$. Here, $\gamma$ is equivalent to the rotation angle $\theta$ of the external magnetic field H relative to the sensor group 30, thus making it possible to determine the rotation angle $\theta$.

[Operation and Workings of Sensor Unit 1A]

The sensor unit 1A according to the present embodiment makes it possible to detect, by means of the sensor group 30, a magnitude of the rotation angle $\theta$ of the external magnetic field H in the X-Y plane, for example.

In the sensor unit 1A, when the external magnetic field H rotates relative to the sensor group 30, a change in magnetic field component in the X-axis direction and a change in magnetic field component in the Y-axis direction, both reaching the sensor group 30, are detected by the MR devices 41A to 41D in the magnetic sensor section 41 and the MR devices 42A to 42D in the magnetic sensor section 42. At that time, the differential signals S1 and S2 that represent the changes illustrated in FIG. 5, for example, are supplied into the arithmetic circuit 21 as outputs from the respective bridge circuits 411 and 421. Thereafter, it is possible to determine the rotation angle $\theta$ of the external magnetic field H by the arithmetic circuit 21 on the basis of the expression: $\text{Arctan}(\alpha \sin \theta/\beta \cos \theta)$.

[Effect of Sensor Unit 1A]

According to the sensor unit 1A, characteristics of the detection on the external magnetic field H are improved in the sensors 31 to 33 that are included in the sensor group 30.

Specifically, a decrease in orthogonality (orthogonality) is suppressed in each of the sensors 31 to 33 even in a case where a change in temperature occurs. The term "orthogonality" as used herein refers to an amount of shift, from a set value (e.g., 90 degrees), of the phase of the output (the differential signal S2) outputted by the magnetic sensor section 42 relative to the phase of the output (the differential signal S1) outputted by the magnetic sensor section 41, for example. The closer the amount of shift is to zero, the more preferable the amount of shift is.

A reason that the decrease in orthogonality of the sensors 31 to 33 is suppressed in the sensor unit 1A according to the present embodiment is presumably due to placement of each of the sensors 31 to 33 at a position at which a distortion of the substrate 10 caused by the change in temperature is relatively small. In other words, the plurality of sensors 31 to 33 are presumably less susceptible to the distortion of the substrate 10 owing to arrangement of the plurality of sensors 31 to 33 on the first axis J1, of the substrate 10 having the substantially-rectangular planar shape, that is substantially parallel to the first side 11 and passes through the center position 10J. Note that causes of the change in temperature include heat generation of the IC chip 20, besides a change in temperature of a surrounding environment.

In particular, in the sensor unit 1A according to the present embodiment, the plurality of sensors 31 to 33 are arranged in a direction (here, the X-axis direction) that coincides with a direction in which the plurality of leads 40 are arranged, thus making it possible to further mitigate the stress to be applied to each of the sensors 31 to 33. A reason is that it is possible to allow a distance in the Y-axis direction between the sensors 31 to 33 and respective connection points at which the plurality of leads 40 and the substrate 10 are connected to be substantially constant. Hence, it is possible to avoid the decrease in orthogonality of the sensors 31 to 33.

First Modification Example of First Embodiment
(Modification Example 1-1)

Figure 7:
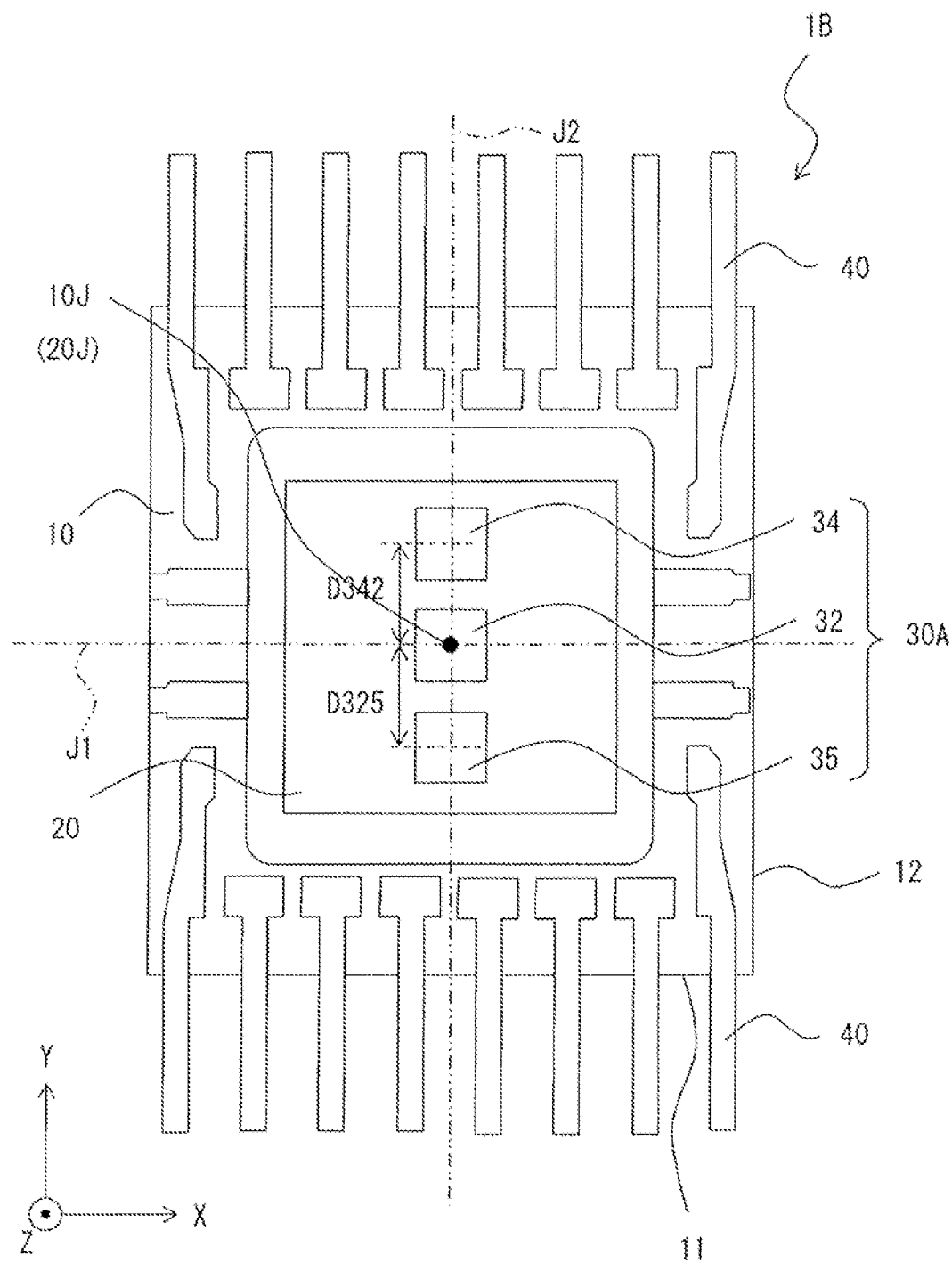
FIG. 7 is a plan view of an overall configuration of a sensor unit according to a first modification example of the first embodiment.

FIG. 7 is a plan view of an example of an overall configuration of a sensor unit 1B according to a first modification example (modification example 1-1) of the present embodiment. In the sensor unit 1A according to the foregoing first embodiment, the plurality of sensors 31 to 33 are arranged on the first axis J1 that is substantially parallel to the direction in which the plurality of leads 40 are arranged (the X-axis direction). In contrast, according to the present modification example, a plurality of sensors 34, 32, and 35 are arranged in order on a second axis J2 that is substantially orthogonal to the direction in which the plurality of leads 40 are arranged (the X-axis direction) and passes through the center position 10J (20J). Here, the sensor 34 and the sensor 35 may be so disposed as to be symmetric with respect to a line and a point around the sensor 32. In other words, it is desirable that a distance D342 between the sensor 34 and the sensor 32 and a distance D325 between the sensor 32 and the sensor 35 be substantially equal to each other. Disposing the sensors 34, 32, and 35 in this manner also makes it possible to avoid the decrease in orthogonality of the sensors 34, 32, and 35.

Second Modification Example of First Embodiment (Modification Example 1-2)

Figure 8:
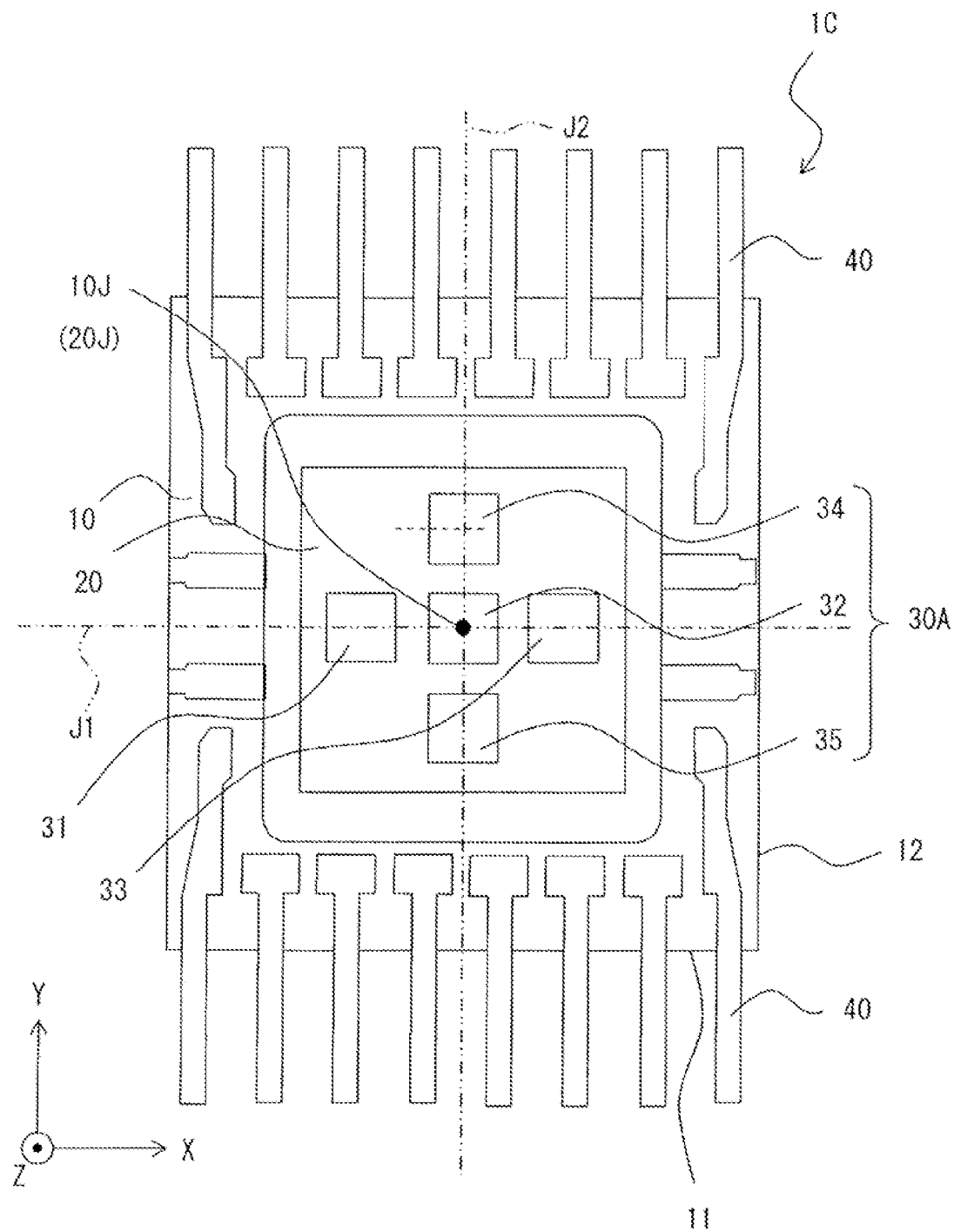
FIG. 8 is a plan view of an overall configuration of a sensor unit according to a second modification example of the first embodiment.

FIG. 8 is a plan view of an example of an overall configuration of a sensor unit 1C according to a second modification example (modification example 1-2) of the present embodiment. According to the present modification example, the plurality of sensors are arranged on both of the first axis J1 and the second axis J2. Specifically, the sensors 31, 32, and 33 are so configured as to be arranged on the first axis J1 and the sensors 34, 32, and 35 are so configured as to be arranged on the second axis J2. The sensors 31 to 35 may be disposed at respective positions that are rotational symmetric about the center position 10J (20J). Disposing the sensors 31 to 35 in this manner also makes it possible to avoid the decrease in orthogonality of the sensors 31 to 35.

Third Modification Example of First Embodiment (Modification Example 1-3)

Figure 9:
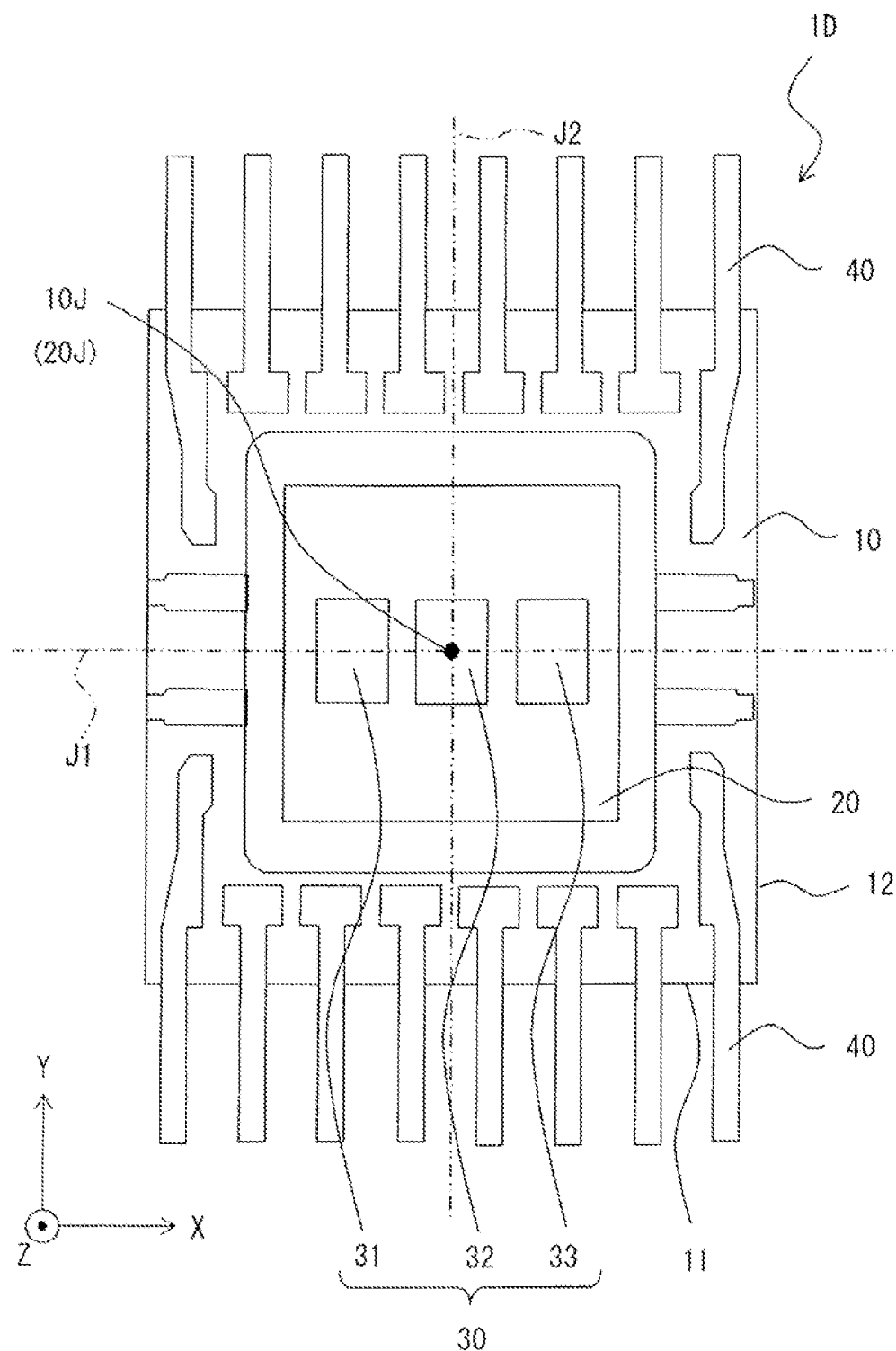
FIG. 9 is a plan view of an overall configuration of a sensor unit according to a third modification example of the first embodiment.

FIG. 9 is a plan view of an example of an overall configuration of a sensor unit 1D according to a third modification example (modification example 1-3) of the present embodiment. In the sensor unit 1A according to the foregoing first embodiment, the plurality of sensors 31 to 33 each have a square planar shape. In contrast, according to the present modification example, the sensors 31 to 33 are each so configured that, as compared with a size in the direction in which the sensors 31 to 33 are arranged (the X-axis direction), a size in a direction orthogonal to the arrangement direction thereof (the Y-axis direction) becomes large. Allowing each of the sensors 31 to 33 to have such as shape (a rectangle) also makes it possible to avoid the decrease in orthogonality and to avoid a decrease in amplitude ratio as well. The term "amplitude ratio" as used herein refers to a ratio of amplitude of the output from the magnetic sensor section 42 (the differential signal S2) to amplitude of the output from the magnetic sensor section 41 (the differential signal S1), for example. The closer the amplitude ratio is to one, the more preferable the amplitude ratio is.

Fourth Modification Example of First Embodiment (Modification Example 1-4)

Figure 10:
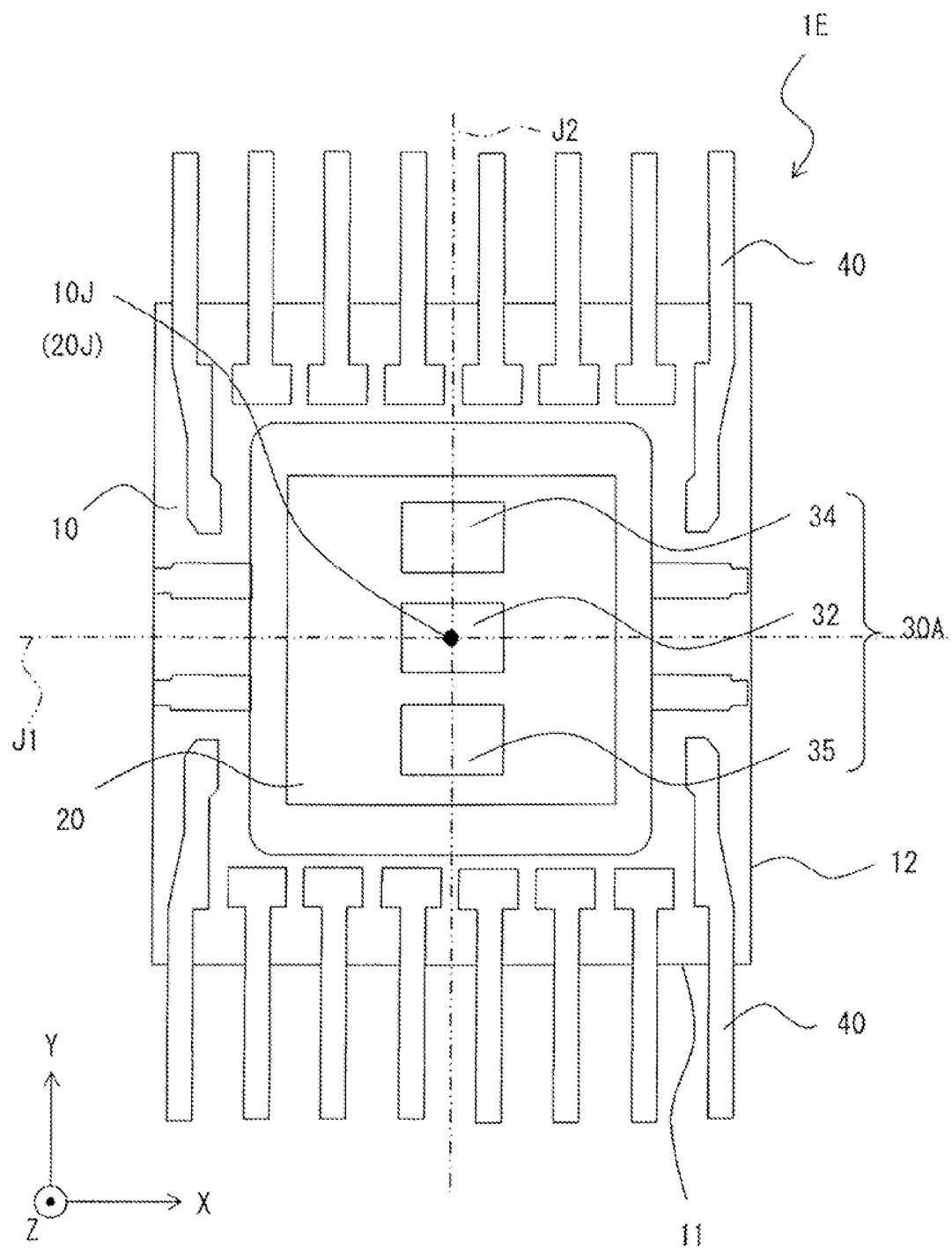
FIG. 10 is a plan view of an overall configuration of a sensor unit according to a fourth modification example of the first embodiment.

FIG. 10 is a plan view of an example of an overall configuration of a sensor unit 1E according to a fourth modification example (modification example 1-4) of the present embodiment. According to the present modification example, the sensors 34, 32, and 35 are so configured as to be arranged on the second axis J2, and the sensors 34, 32, and 35 are each so configured that, as compared with the size in the direction in which the sensors 34, 32, and 35 are arranged (the Y-axis direction), the size in the direction orthogonal to the arrangement direction thereof (the X-axis direction) becomes large. It is also possible for the present modification example to avoid the decrease in orthogonality of the sensors 34, 32, and 35 and to avoid the decrease in amplitude ratio as well.

Fifth Modification Example of First Embodiment (Modification Example 1-5)

Figure 11:
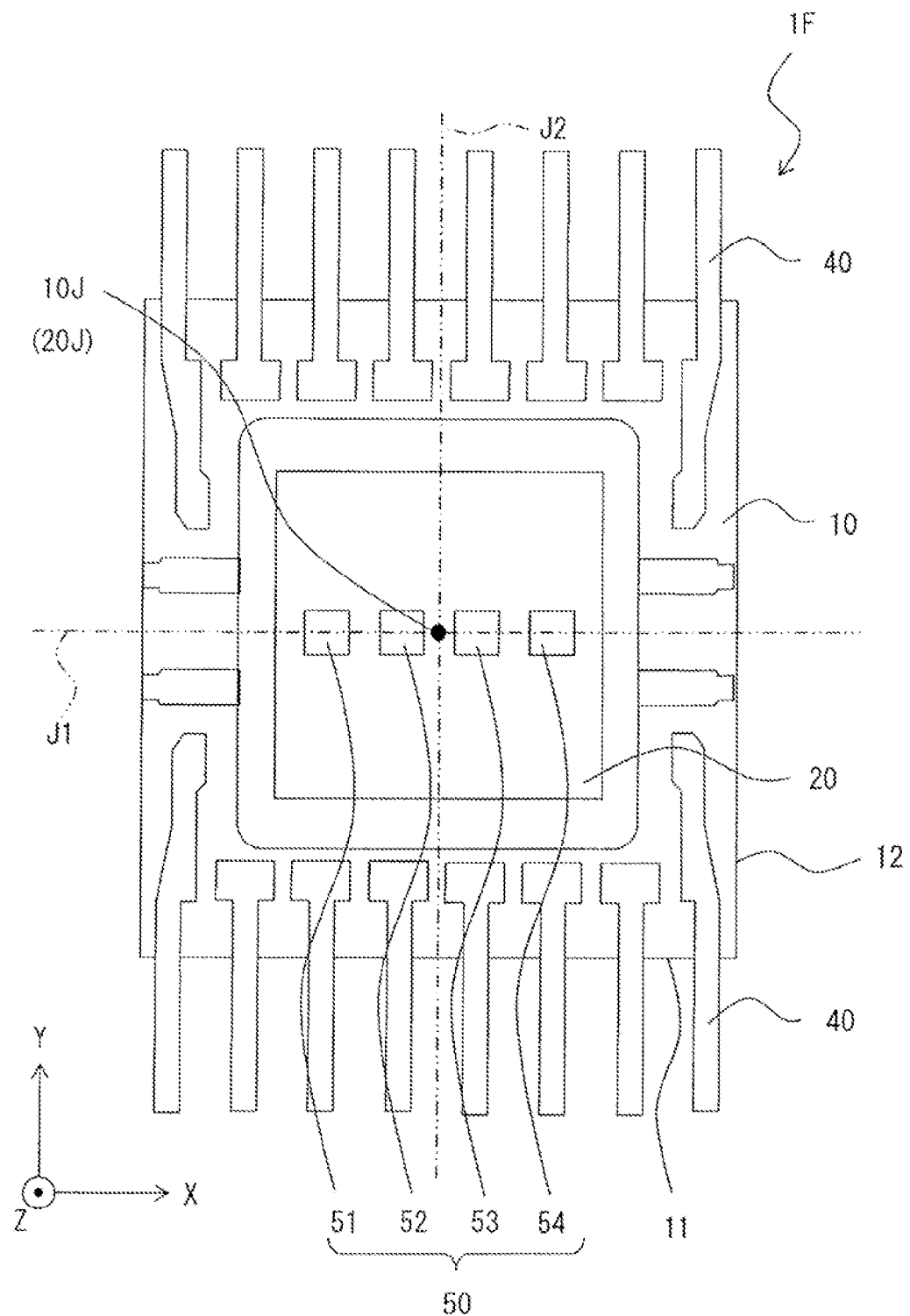
FIG. 11 is a plan view of an overall configuration of a sensor unit according to a fifth modification example of the first embodiment.

FIG. 11 is a plan view of an example of an overall configuration of a sensor unit 1F according to a fifth modification example (modification example 1-5) of the present embodiment. According to the present modification example, even number of sensors 51 to 54 are arranged on the first axis J1. In the present modification example, the sensor 51 and the sensor 54 may be disposed symmetrically and the sensor 52 and the sensor 53 may be disposed symmetrically, both with respect to the second axis J2 as an axis of symmetry. Disposing the sensors 51 to 54 in this manner also makes it possible to avoid the decrease in orthogonality of the sensors 51 to 54.

Sixth Modification Example of First Embodiment (Modification Example 1-6)

Figure 12:
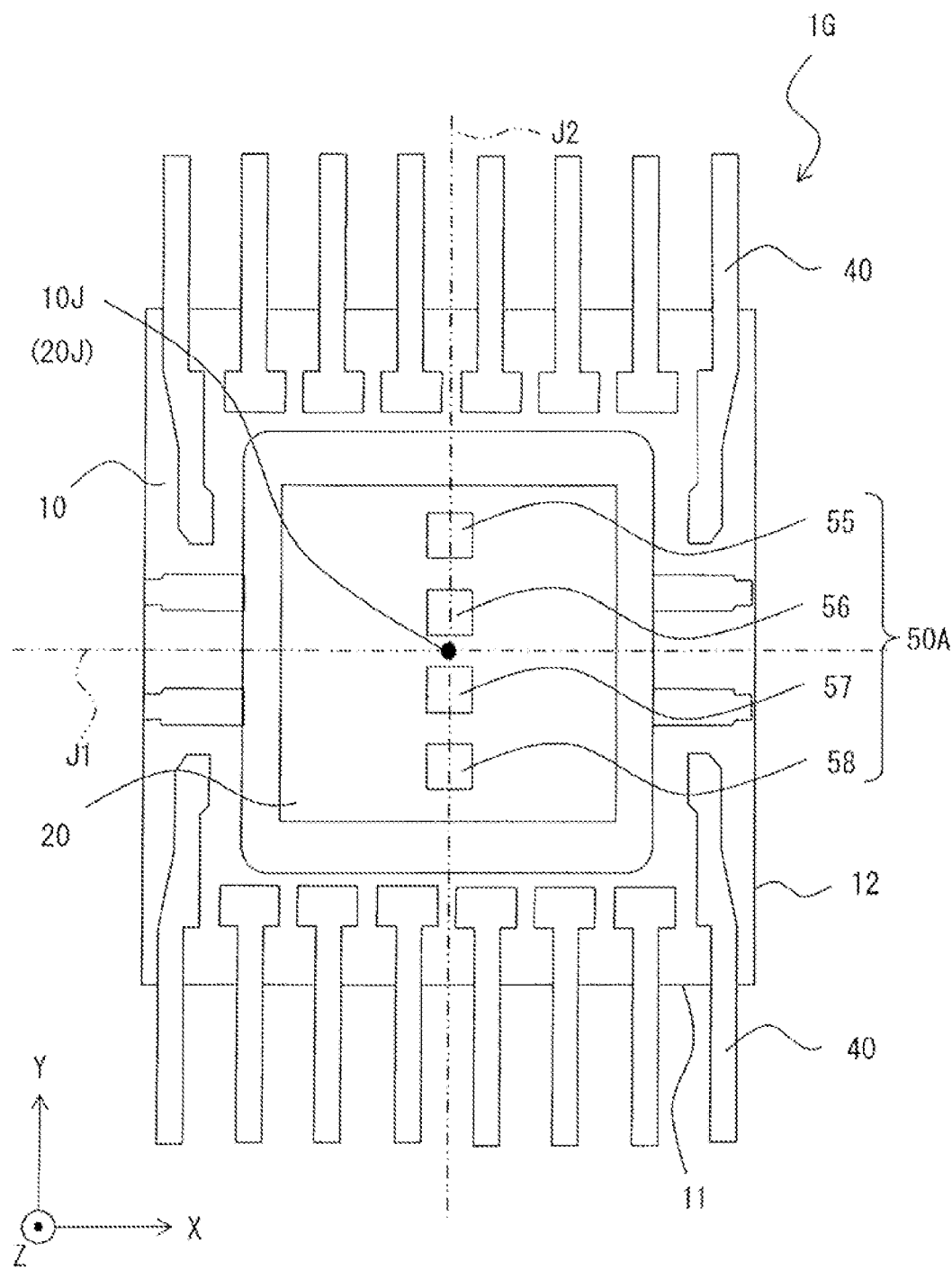
FIG. 12 is a plan view of an overall configuration of a sensor unit according to a sixth modification example of the first embodiment.

FIG. 12 is a plan view of an example of an overall configuration of a sensor unit 1G according to a sixth modification example (modification example 1-6) of the present embodiment. According to the present modification example, even number of sensors 55 to 58 are arranged on the second axis J2. In the present modification example, the sensor 55 and the sensor 58 may be disposed symmetrically and the sensor 56 and the sensor 57 may be disposed symmetrically, both with respect to the first axis J1 as the axis of symmetry. Disposing the sensors 55 to 58 in this manner also makes it possible to avoid the decrease in orthogonality of the sensors 55 to 58.

Seventh Modification Example of First Embodiment (Modification Example 1-7)

Figure 13:
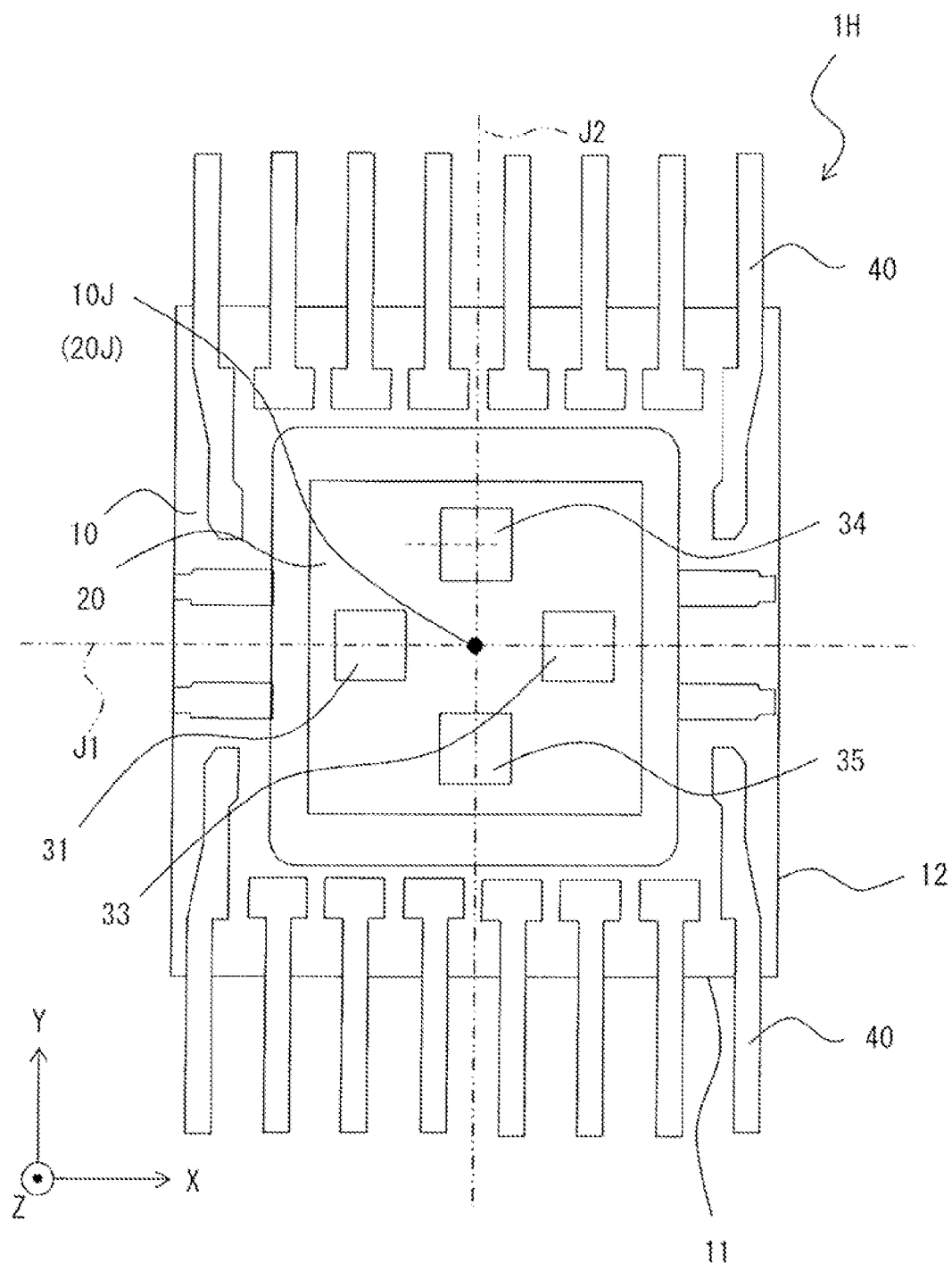
FIG. 13 is a plan view of an overall configuration of a sensor unit according to a seventh modification example of the first embodiment.

FIG. 13 is a plan view of an example of an overall configuration of a sensor unit 1H according to a seventh modification example (modification example 1-7) of the present embodiment. According to the present modification example, the plurality of sensors are arranged on both of the first axis J1 and the second axis J2. Specifically, the sensors 31 and 33 are so configured as to be arranged on the first axis J1 and the sensors 34 and 35 are so configured as to be arranged on the second axis J2. The sensors 31, 33, 34, and 35 may be disposed at respective positions that are rotational symmetric about the center position 10J (20J). Disposing the sensors 31, 33, 34, and 35 in this manner also makes it possible to avoid the decrease in orthogonality of the sensors 31, 33, 34, and 35.

2. Second Embodiment

[Configuration of Sensor Unit 2A]

Figure 14:
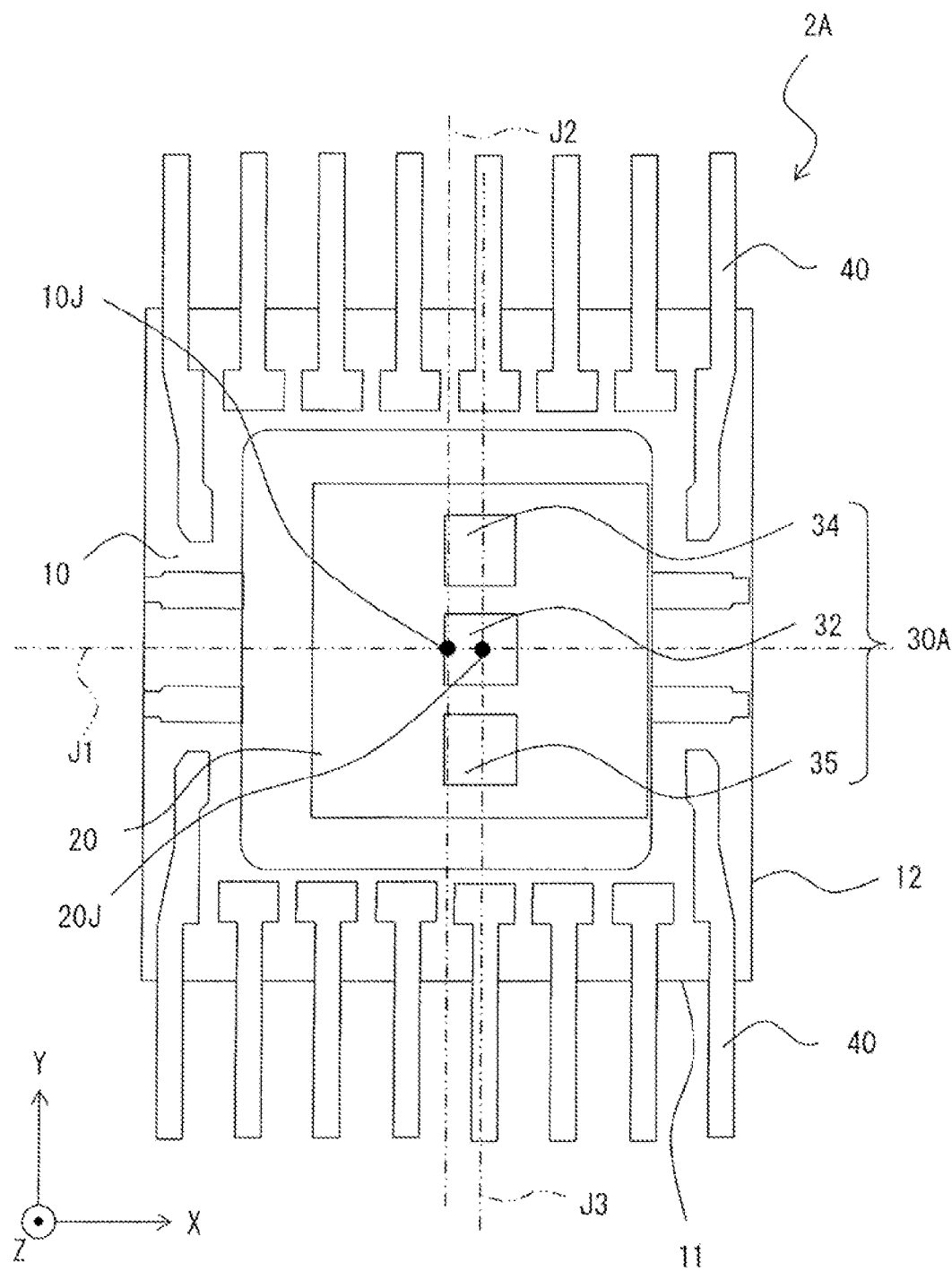
FIG. 14 is a plan view of an overall configuration of a sensor unit according to a second embodiment of the invention.

FIG. 14 is a plan view of an example of an overall configuration of a sensor unit 2A according to a second embodiment of the invention. The sensor units 1A and 1B according to the foregoing first embodiment are each so configured that the center position 20J of the IC chip 20 and the center position 10J of the substrate 10 are brought into coincidence with each other substantially. In contrast, the sensor unit 2A according to the present embodiment is so configured that the center position 20J of the IC chip 20 and the center position 10J of the substrate 10 are made different from each other. Specifically, the center position 20J of the IC chip 20 is located at a position moved in the +X direction from the center position 10J of the substrate 10. Further, the sensors 31 to 33 are so disposed as to be arranged on a third axis J3 that is orthogonal to the first axis J1 and passes through the center position 20J of the IC chip 20.

It is also possible for the sensor unit 2A according to the present embodiment to avoid the decrease in orthogonality of the sensors 31 to 33.

Modification Example of Second Embodiment
(Modification Example 2-1)

Figure 15:
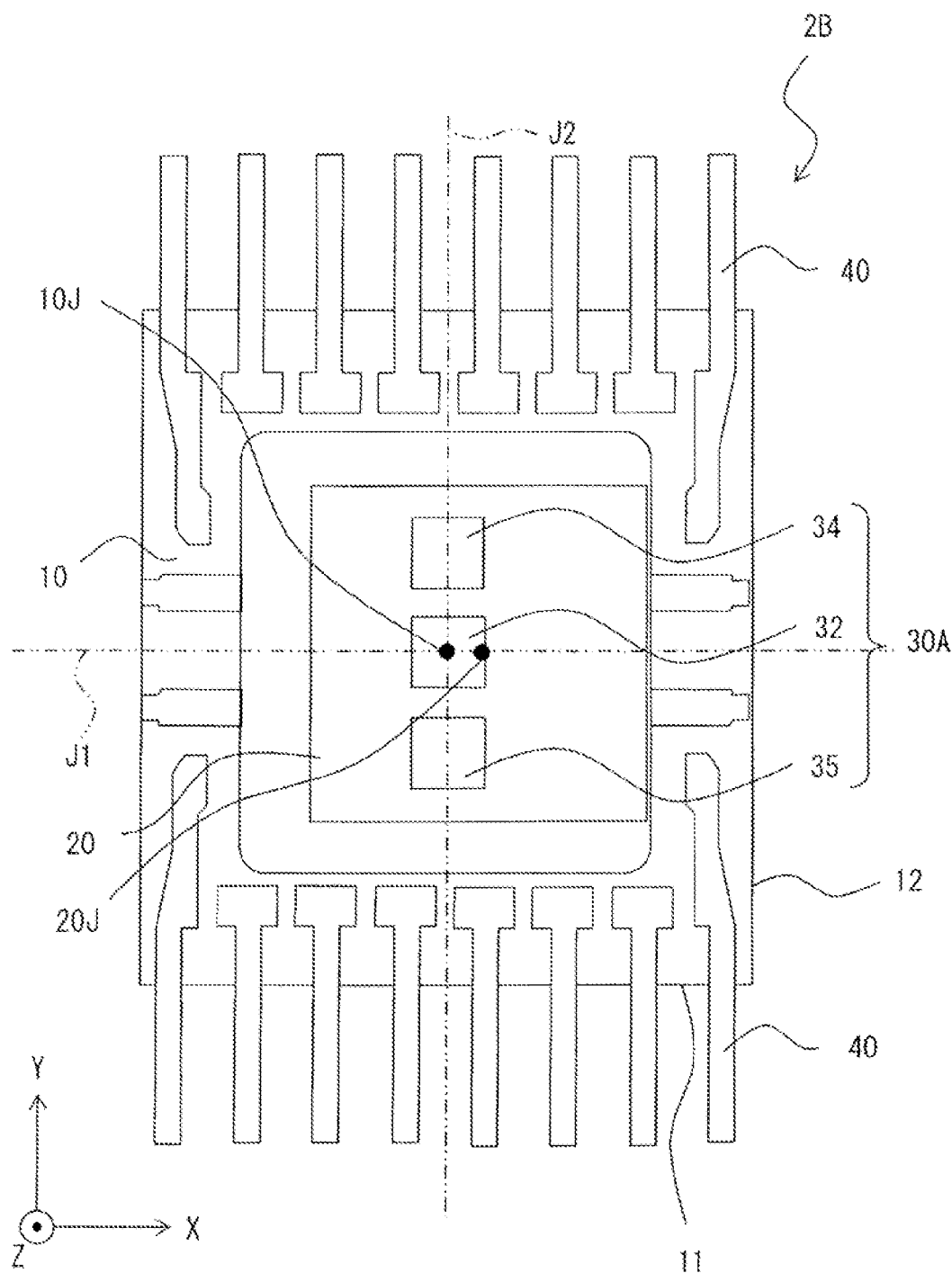
FIG. 15 is a plan view of an overall configuration of a sensor unit according to a first modification example of the second embodiment.

FIG. 15 is a plan view of an example of an overall configuration of a sensor unit 2B according to a first modification example (modification example 2-1) of the present embodiment. The present modification example has a configuration similar to that of the foregoing sensor unit 2A, with exception that the sensors 34, 32, and 35 are arranged in order on the second axis J2. Disposing the sensors 34, 32, and 35 in this manner also makes it possible to avoid the decrease in orthogonality of the sensors 34, 32, and 35.

3. First Experimental Example

Samples were fabricated of the respective sensor units 1A to 1H, 2A, and 2B referred to in the foregoing first and second embodiments and their modification examples to measure the amplitude ratio (%) and the orthogonality (deg) of each of them. Here, experimental example 1A corresponds to the sensor unit 1A of FIG. 1, experimental example 1B corresponds to the sensor unit 1B of FIG. 7, experimental example 1C corresponds to the sensor unit 1C of FIG. 8, experimental example 1D corresponds to the sensor unit 1D of FIG. 9, experimental example 1E corresponds to the sensor unit 1E of FIG. 10, experimental example 1F corresponds to the sensor unit 1F of FIG. 11, experimental example 1G corresponds to the sensor unit 1G of FIG. 12, experimental example 1H corresponds to the sensor unit 1H of FIG. 13, experimental example 2A corresponds to the sensor unit 2A of FIG. 14, and experimental example 2B corresponds to the sensor unit 2B of FIG. 15.

Figure 16:
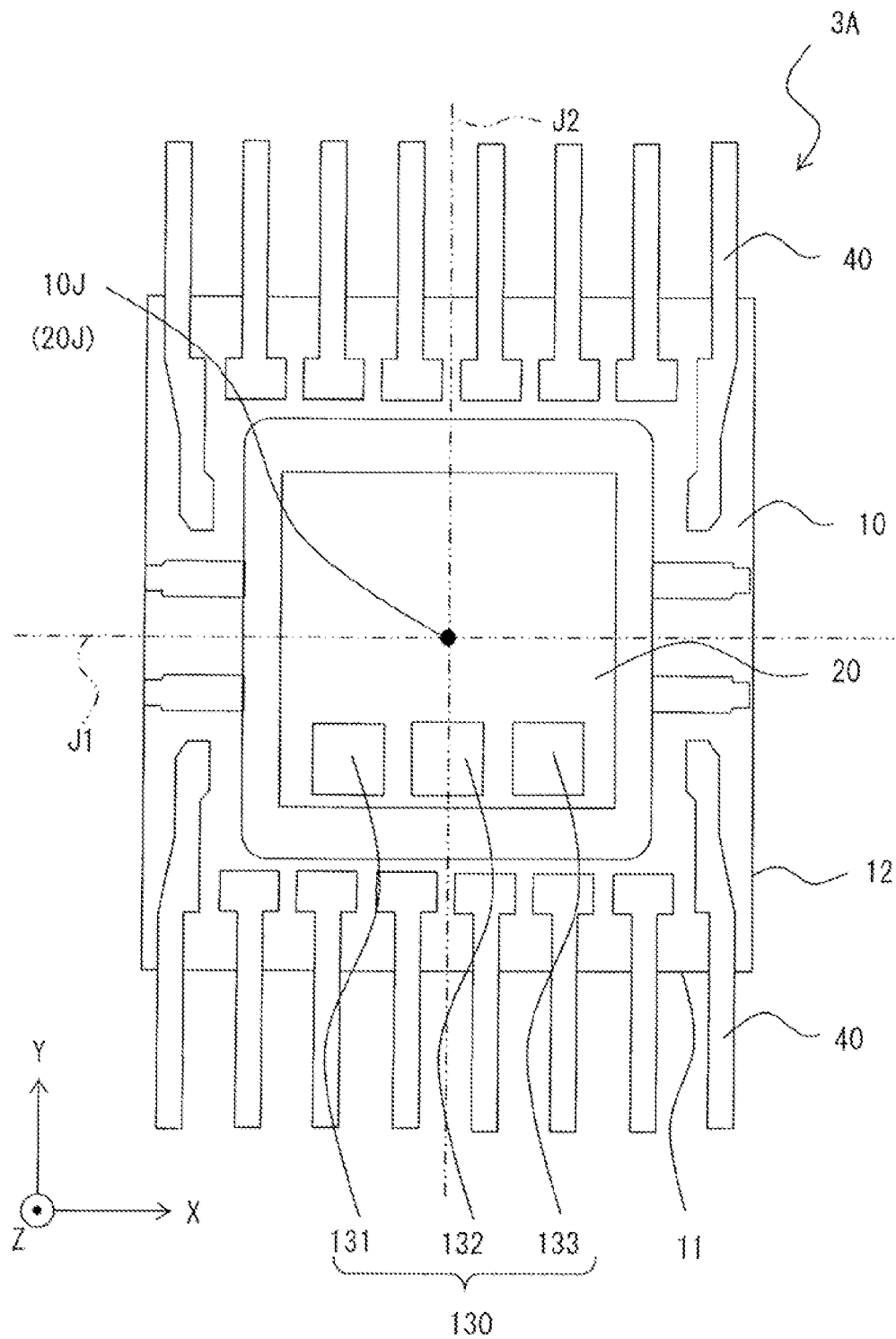
FIG. 16 is a plan view of an overall configuration of a sensor unit according to a first reference example.
Figure 17:
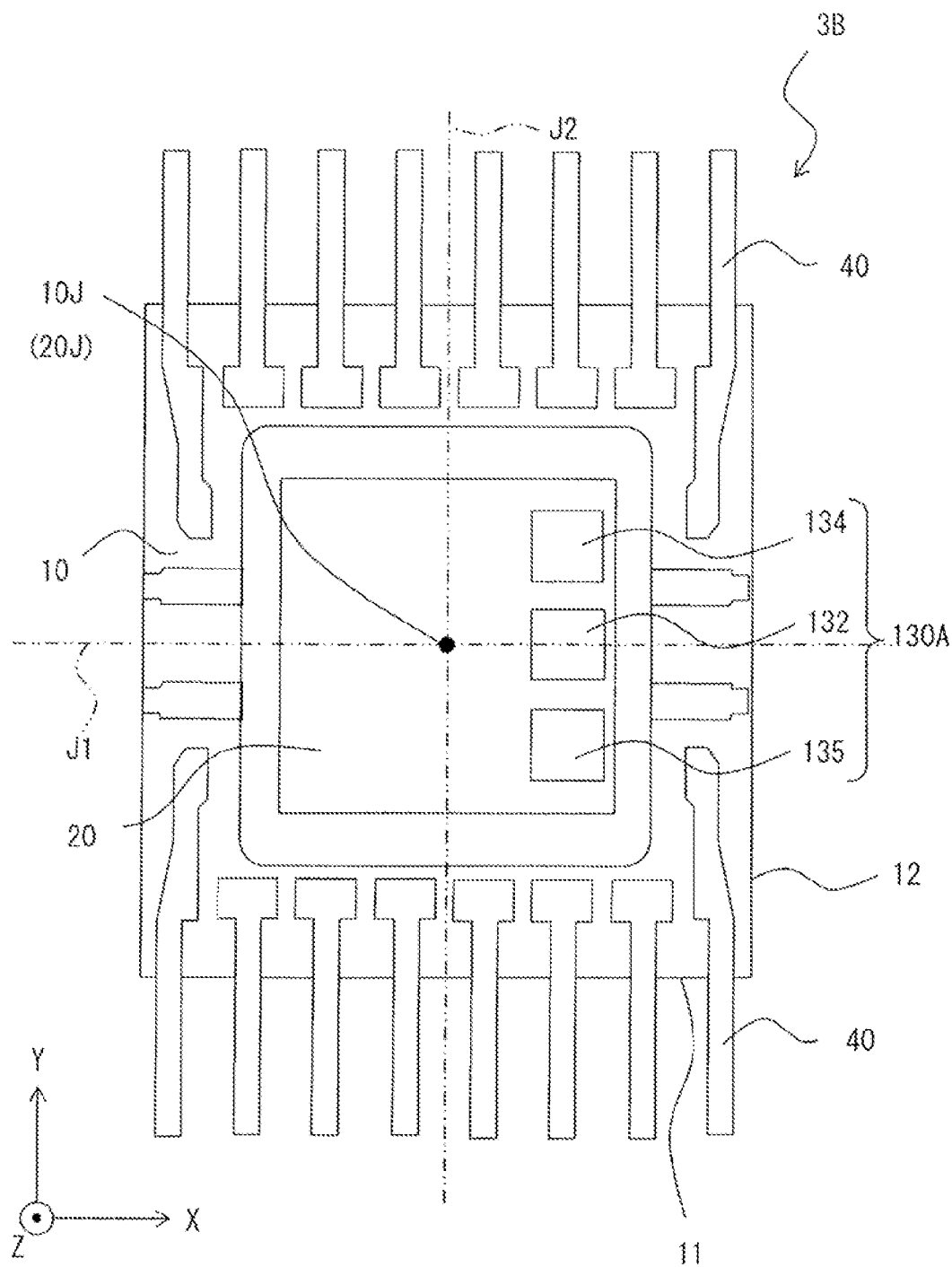
FIG. 17 is a plan view of an overall configuration of a sensor unit according to a second reference example.
Figure 18:
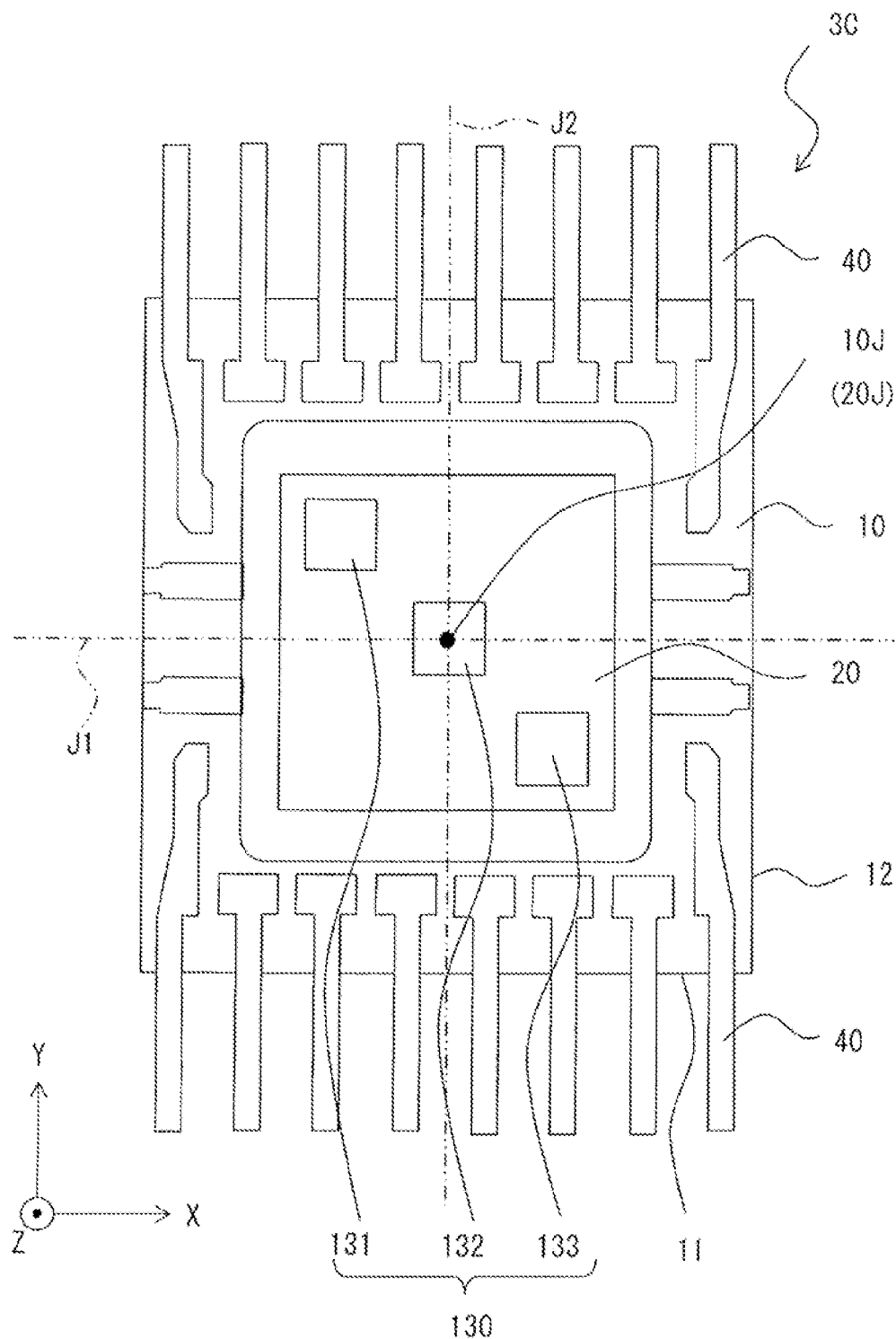
FIG. 18 is a plan view of an overall configuration of a sensor unit according to a third reference example.

Further, experimental example 3A corresponds to a sensor unit 3A according to a reference example illustrated in FIG. 16, experimental example 3B corresponds to a sensor unit 3B according to a reference example illustrated in FIG. 17, and experimental example 3C corresponds to a sensor unit 3C according to a reference example illustrated in FIG. 18. The sensor unit 3A of FIG. 16 includes a sensor group 130 having sensors 131 to 133 that are arranged in the X-axis direction at respective positions off the first axis J1. The sensor unit 3B of FIG. 17 includes a sensor group 130A having sensors 134, 132, and 135 that are arranged in the Y-axis direction at respective positions off the second axis J2. The sensor unit 3C of FIG. 18 includes the sensor group 130 having the sensors 131 to 133 that are arranged in a direction oblique to both the first axis J1 and the second axis J2.

Figure 19:
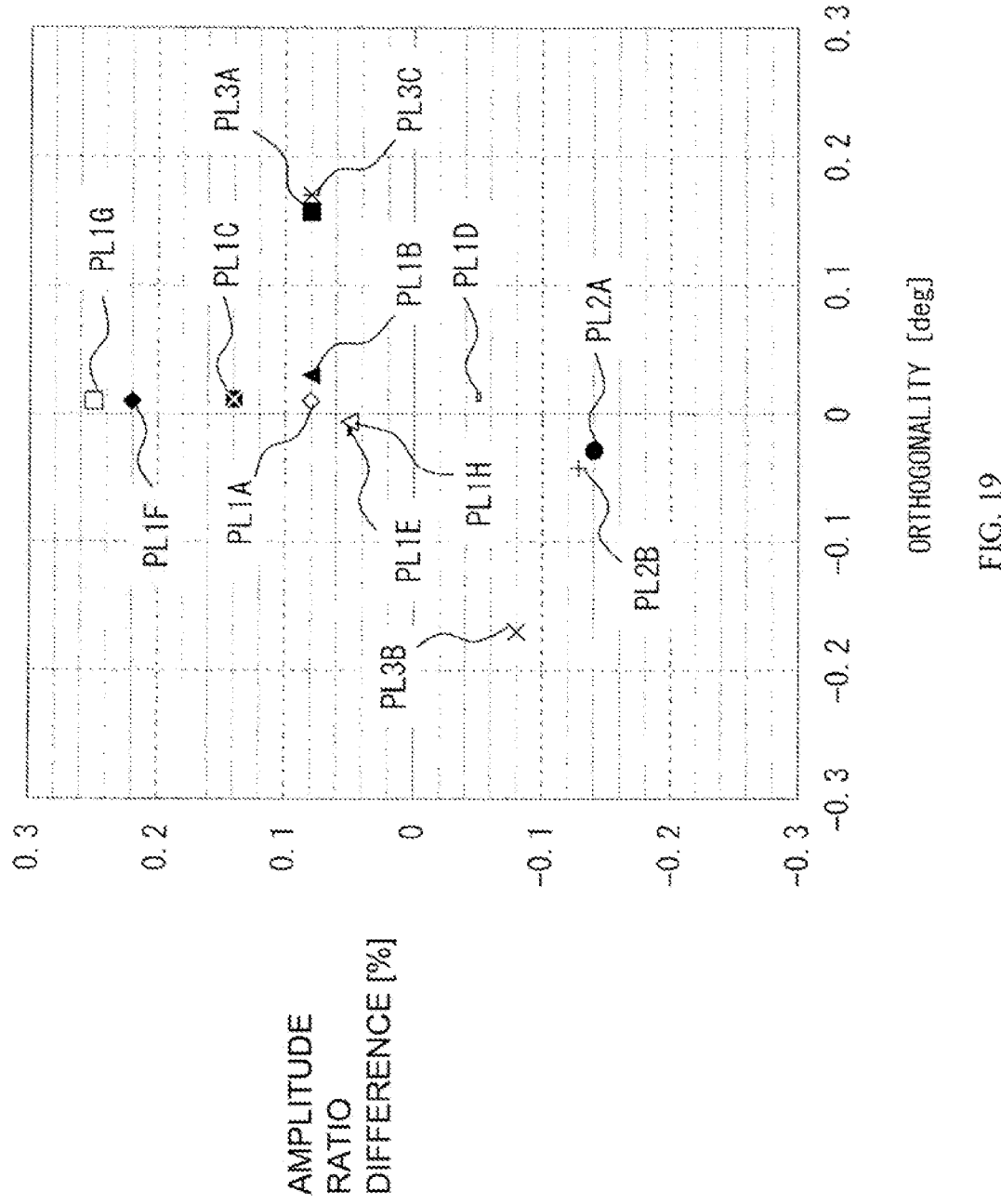
FIG. 19 is a characteristic diagram illustrating characteristic values of sensors according to a first experimental example.

FIG. 19 illustrates a relationship of the orthogonality versus a difference between amplitude ratio before heating of a substrate and amplitude ratio after the heating of the substrate (hereinafter simply referred to as an amplitude ratio difference), for each of the samples. As used herein, the wording "the amplitude ratio after the heating of the substrate" refers to the amplitude ratio measured immediately after causing the substrate 10 to be held at a temperature of 120 degrees centigrade for 24 hours. The amplitude ratio before the heating of the substrate is the amplitude ratio measured at a room temperature (23 degrees centigrade). The closer the amplitude ratio difference is to zero, the more preferable the amplitude ratio difference is. It is most preferable that the amplitude ratio difference be substantially zero. In FIG. 19, a horizontal axis denotes the orthogonality [deg] whereas a vertical axis denotes the amplitude ratio difference [%]. Note that plots corresponding to the respective experimental examples 1A to 3C are denoted with their respective reference signs PL1A to PL3C in FIG. 19. FIG. 19 illustrates data that corresponds to a sensor located at a surrounding part of any of the samples. Specifically, in FIG. 19, the experimental example 1A (FIG. 1) illustrates data corresponding to the sensor 33, the experimental example 1B (FIG. 7) illustrates data corresponding to the sensor 35, the experimental example 1C (FIG. 8) illustrates data corresponding to the sensor 33, the experimental example 1D (FIG. 9) illustrates data corresponding to the sensor 33, the experimental example 1E (FIG. 10) illustrates data corresponding to the sensor 35, the experimental example 1F (FIG. 11) illustrates data corresponding to the sensor 54, the experimental example 1G (FIG. 12) illustrates data corresponding to the sensor 58, the experimental example 1H (FIG. 13) illustrates data corresponding to the sensor 33, the experimental example 2A (FIG. 14) illustrates data corresponding to the sensor 35, the experimental example 2B (FIG. 15) illustrates data corresponding to the sensor 35, the experimental example 3A (FIG. 16) illustrates data corresponding to the sensor 133, the experimental example 3B (FIG. 17) illustrates data corresponding to the sensor 135, and the experimental example 3C (FIG. 18) illustrates data corresponding to the sensor 133.

As illustrated in FIG. 19, degradation of the orthogonality was observed for the experimental examples 3A to 3C (the plots PL3A to PL3C) according to the reference examples. However, relatively fine orthogonality was obtained for the rest of the experimental examples. Among them, better amplitude ratio was obtained for the experimental examples 1A and 1B (FIG. 1 and FIG. 7), and even better amplitude ratio was obtained for the experimental examples 1D, 1E, and 1H (FIG. 9, FIG. 10, and FIG. 13).

4. Third Embodiment

[Configuration of Sensor Unit 101A]

Figure 20:
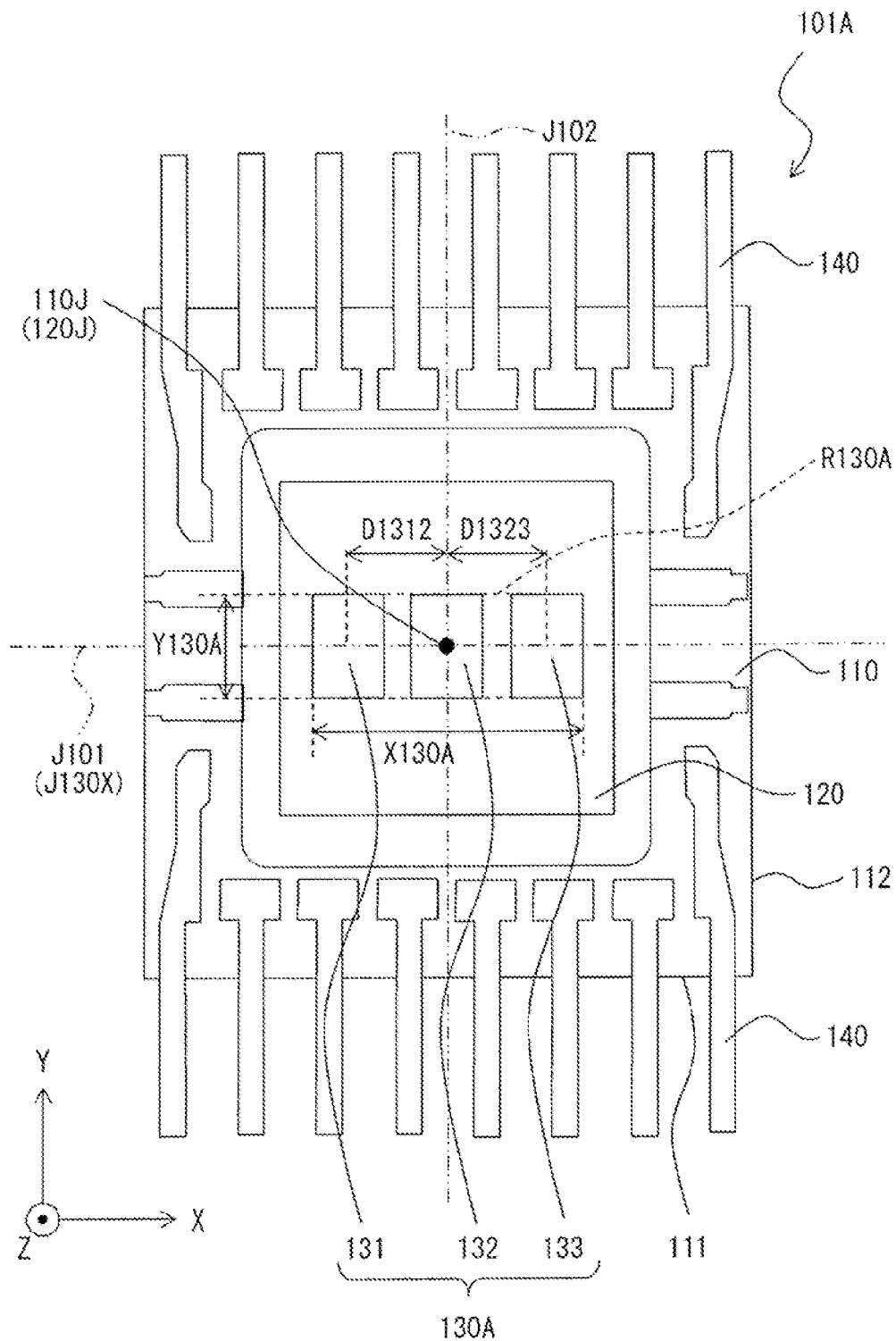
FIG. 20 is a plan view of an overall configuration of a sensor unit according to a third embodiment of the invention.

First, a description is given, with reference to FIG. 20 in addition to FIGS. 2 to 6 according to the first embodiment, of a configuration of a sensor unit 101A according to a third embodiment of the invention. FIG. 20 is a plan view of an example of an overall configuration of the sensor unit 101A. The foregoing FIG. 2 is equivalent to a cross-section of the sensor unit 101A taken along a first axis J101 illustrated in FIG. 20. The foregoing FIG. 3 is equivalent to a circuit diagram that illustrates a schematic configuration of the sensor unit 101A. The sensor unit 101A is used as the angle detection sensor used for the detection of the rotation angle of the rotating body, for example.

The sensor unit 101A includes a substrate 110, an integrated circuit (IC) chip 120 stacked on the substrate 110, a sensor group 130A stacked on the IC chip 120, and a plurality of leads 40. Note that a combination of the substrate 110 and the IC chip 120 is one specific example of the "base" according to the invention.

The substrate 110 has a substantially-rectangular planar shape including a first side 111 and a second side 112 that are substantially orthogonal to each other. Here, a length of the first side 111 and a length of the second side 112 may be substantially equal to each other and the planar shape of the substrate 110 may be substantially square. The term "substantially" means to tolerate a displacement of a level which results from a factor such as a manufacturing error. Note that, herein, a direction in which the first side 111 extends is defined as the X-axis direction, a direction in which the second side 112 extends is defined as the Y-axis direction, and a thickness direction of the substrate 110 (a direction perpendicular to the plane of drawing of FIG. 20) is defined as the Z-axis direction. Further, in FIG. 20, a center position of the substrate 110, i.e., an intersection of a second axis J102 that passes through a center position in the X-axis direction of the substrate 110 and the first axis J101 that passes through a center position in the Y-axis direction of substrate 110, is denoted with a reference sign 110J. In the present embodiment, the plurality of leads 140 each have one end provided on the substrate 110, and are arranged along the first side 111.

The IC chip 120 has a rectangular planar shape, and has occupancy area that is smaller than the substrate 110. In the sensor unit 101A, a center position 120J of the IC chip 120, i.e., an intersection of a line that passes through a center position in the X-axis direction of the IC chip 120 and a line that passes through a center position in the Y-axis direction of the IC chip 120, is substantially coincident with the center position 110J of the substrate 110. Note that the wording "the center position 120J and the center position 110J are coincident with each other" means to tolerate a displacement in a range of about ±30 μm which results from a factor such as a manufacturing error. In addition, the IC chip 120 includes the arithmetic circuit 21 (see FIG. 3).

The sensor group 130A has n-number of sensors (three sensors 131 to 133 in the present embodiment) arranged on the first axis J101 that passes through the center position 110J (120J) and that is parallel to the X axis, for example (where n is an integer of 2 or greater). A sensor region R130A, in which the sensors 131 to 133 are arrayed, on the substrate 110 has a size X130A in the X-axis direction and a size Y130A in the Y-axis direction, and has occupancy area that is smaller than the IC chip 120. Here, a ratio of the size X130A to the size Y130A, i.e., an aspect ratio, is less than n (here, 3). Note that the closer the aspect ratio is to one, the more preferable the aspect ratio is. It is most preferable that the aspect ratio be substantially one. In addition, the first axis J101 that passes through the center position 110J in the Y-axis direction of the substrate 110 and an axis J130X that passes through a center position in the Y-axis direction of the sensor region R130A are substantially coincident with each other.

The sensors 131 to 133 are each rectangular in planar shape, and each have a size smaller than a size of the IC chip 120. Each of the sensors 131 to 133 has the planar shape in which the size in the Y-axis direction is larger than the size in the X-axis direction. In particular, all of the sensors 131 to 133 may have substantially the same planar shape as each other and may have substantially the same occupancy area as each other. The sensors 131 to 133 include their respective magneto-resistive effect (MR) devices having configurations that are substantially the same as each other, for example. It is desirable that a distance D1312 between the sensor 131 and the sensor 132 on the first axis J101 be substantially equal to a distance D1323 between the sensor 132 and the sensor 133 on the first axis J101. In other words, it is desirable that the n-number of sensors be arrayed at substantially even intervals. Accordingly, the sensor 131 and the sensor 133 are so provided as to be symmetric with respect to a line and a point around the sensor 132 that serves as a center position sensor provided at the center position 110J (120J).

The sensors 131 to 133 have their respective configurations that are similar to those of the respective sensors 31 to 33 illustrated in FIG. 4.

[Operation and Workings of Sensor Unit 101A]

The sensor unit 101A according to the present embodiment makes it possible to detect, by means of the sensor group 130A, a magnitude of the rotation angle θ of the external magnetic field H in the X-Y plane, for example (see FIG. 4).

In the sensor unit 101A, when the external magnetic field H rotates relative to the sensor group 130A, a change in magnetic field component in the X-axis direction and a change in magnetic field component in the Y-axis direction, both reaching the sensor group 130A, are detected by the MR devices 41A to 41D in the magnetic sensor section 41 and the MR devices 42A to 42D in the magnetic sensor section 42. At that time, the differential signals S1 and S2 that represent the changes illustrated in FIG. 5, for example, are supplied into the arithmetic circuit 21 as the outputs from the respective bridge circuits 411 and 421. Thereafter, it is possible to determine the rotation angle θ of the external magnetic field H by the arithmetic circuit 21 on the basis of the expression: Arctan ($\alpha$ sin θ/$\beta$ cos θ).

[Effect of Sensor Unit 101A]

According to the sensor unit 101A, characteristics of the detection on the external magnetic field H are improved in the sensors 131 to 133 that configure the sensor group 130A.

Specifically, the decrease in orthogonality (orthogonality) is suppressed in each of the sensors 131 to 133 even in a case where the change in temperature occurs. The term "orthogonality" as used herein refers to the amount of shift, from a set value (e.g., 90 degrees), of the phase of the output (the differential signal S2) outputted by the magnetic sensor section 42 relative to the phase of the output (the differential signal S1) outputted by the magnetic sensor section 41, for example. The closer the amount of shift is to zero, the more preferable the amount of shift is.

A reason that the decrease in orthogonality of the sensors 131 to 133 is suppressed in the sensor unit 101A according to the present embodiment is presumably due to placement of each of the sensors 131 to 133 at a position at which a distortion of the substrate 110 caused by the change in temperature is relatively small. In other words, the plurality of sensors 131 to 133 are presumably less susceptible to the distortion of the substrate 110 owing to arrangement of the plurality of sensors 131 to 133 on the first axis J101, of the substrate 110 having the substantially-rectangular planar shape, that is substantially parallel to the first side 111 and passes through the center position 110J. Note that causes of the change in temperature include heat generation of the IC chip 120, besides the change in temperature of the surrounding environment.

In particular, in the sensor unit 101A according to the present embodiment, the plurality of sensors 131 to 133 are arranged in a direction (here, the X-axis direction) that coincides with a direction in which the plurality of leads 140 are arranged, thus making it possible to further mitigate the stress to be applied to each of the sensors 131 to 133. A reason is that it is possible to allow a distance in the Y-axis direction between the sensors 131 to 133 and respective connection points at which the plurality of leads 140 and the substrate 110 are connected to be substantially constant. Hence, it is possible to avoid the decrease in orthogonality of the sensors 131 to 133.

Further, in the sensor unit 101A according to the present embodiment, the n-number of sensors (three sensors 131 to 133) are arrayed in the sensor region R130A, on the substrate 110, in which the ratio of the size X130A to the size Y130A is less than n. In other words, the planar shape of each of the sensors 131 to 133 is rectangle in which a direction (here, Y-axis direction) orthogonal to the direction in which the sensors 131 to 133 are arranged is a longitudinal direction. This makes it possible to bring the aspect ratio of the sensor region R130A closer to one as compared with a case where the planar shape of each of the sensors 131 to 133 is square, for example. Hence, it is possible to achieve the improvement in amplitude ratio of each of the sensors 131 to 133 as compared with a case where the n-number of sensors are placed in a sensor region whose aspect ratio is n or greater. The term "amplitude ratio" as used herein refers to the ratio of amplitude (S2/S1) of the output from the magnetic sensor section 42 (the differential signal S2) to amplitude of the output from the magnetic sensor section 41 (the differential signal S1), for example. The closer the amplitude ratio S2/S1 is to one, the more preferable the amplitude ratio is. It is most preferable that the amplitude ratio S2/S1 be substantially one.

First Modification Example of Third Embodiment
(Modification Example 3-1)

Figure 21:
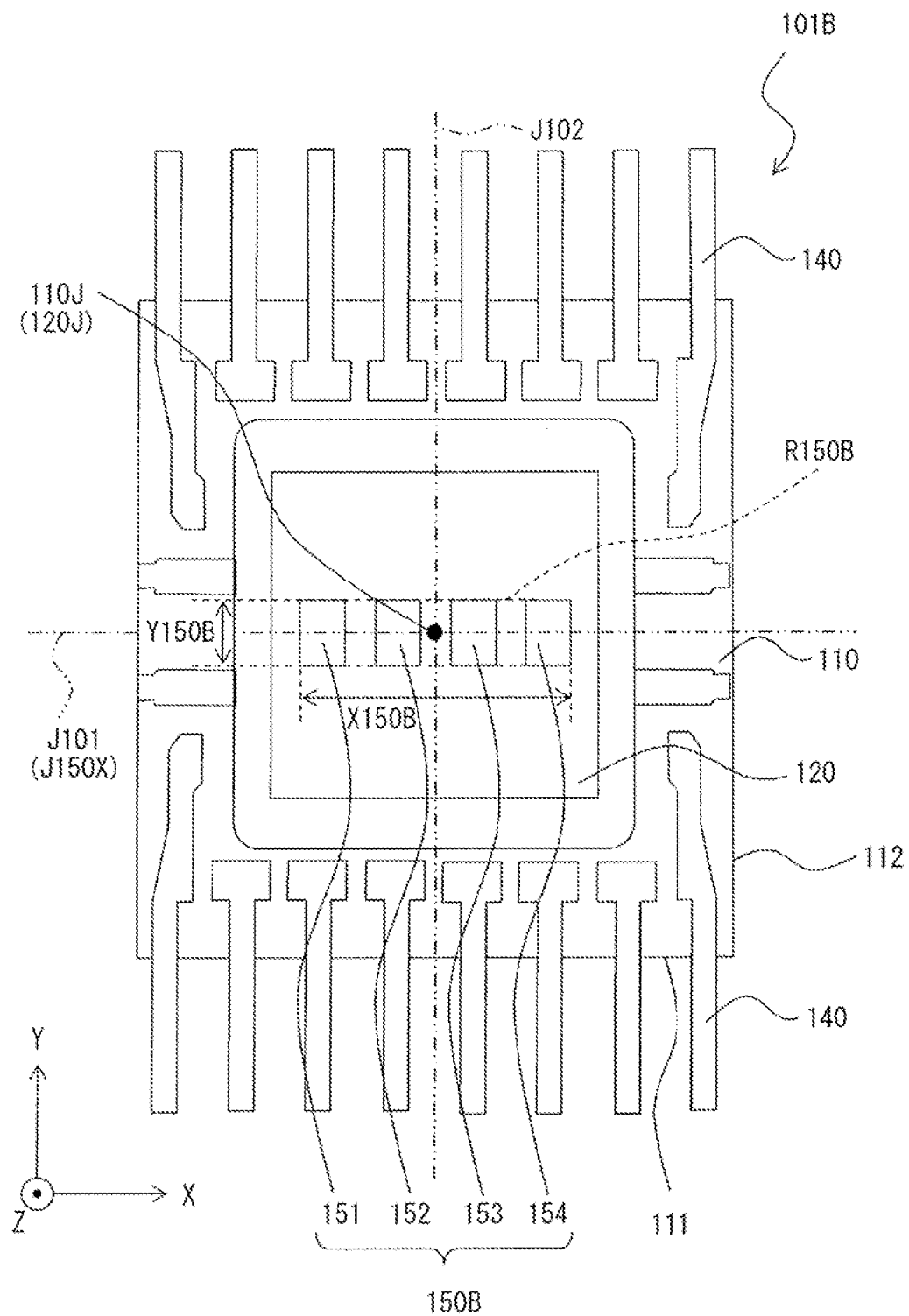
FIG. 21 is a plan view of an overall configuration of a sensor unit according to a first modification example of the third embodiment.

FIG. 21 is a plan view of an example of an overall configuration of a sensor unit 101B according to a first modification example (modification example 3-1) of the present embodiment. For the sensor unit 101A according to the foregoing third embodiment, described is a case where n=3, i.e., a case where the sensor group 130A has the three sensors 131 to 133. In contrast, the sensor unit 101B according to the present modification example has, instead of the sensor group 130A, a sensor group 150B corresponding to n=4, i.e., configured by four sensors 151 to 154. Here, the four sensors 151 to 154 are arranged on the first axis J101, and are arrayed in a sensor region R150B in which the ratio of a size X150B to a size Y150B is less than 4. Thus, it is also possible for the present modification example to achieve the improvement in the amplitude ratio of the sensors 151 to 154. Note that the first axis J101 that passes through the center position 110J of the substrate 110 and an axis J150X that passes through a center position in the Y-axis direction of the sensor region R150B are substantially coincident with each other.

Second Modification Example of Third Embodiment (Modification Example 3-2)

Figure 22:
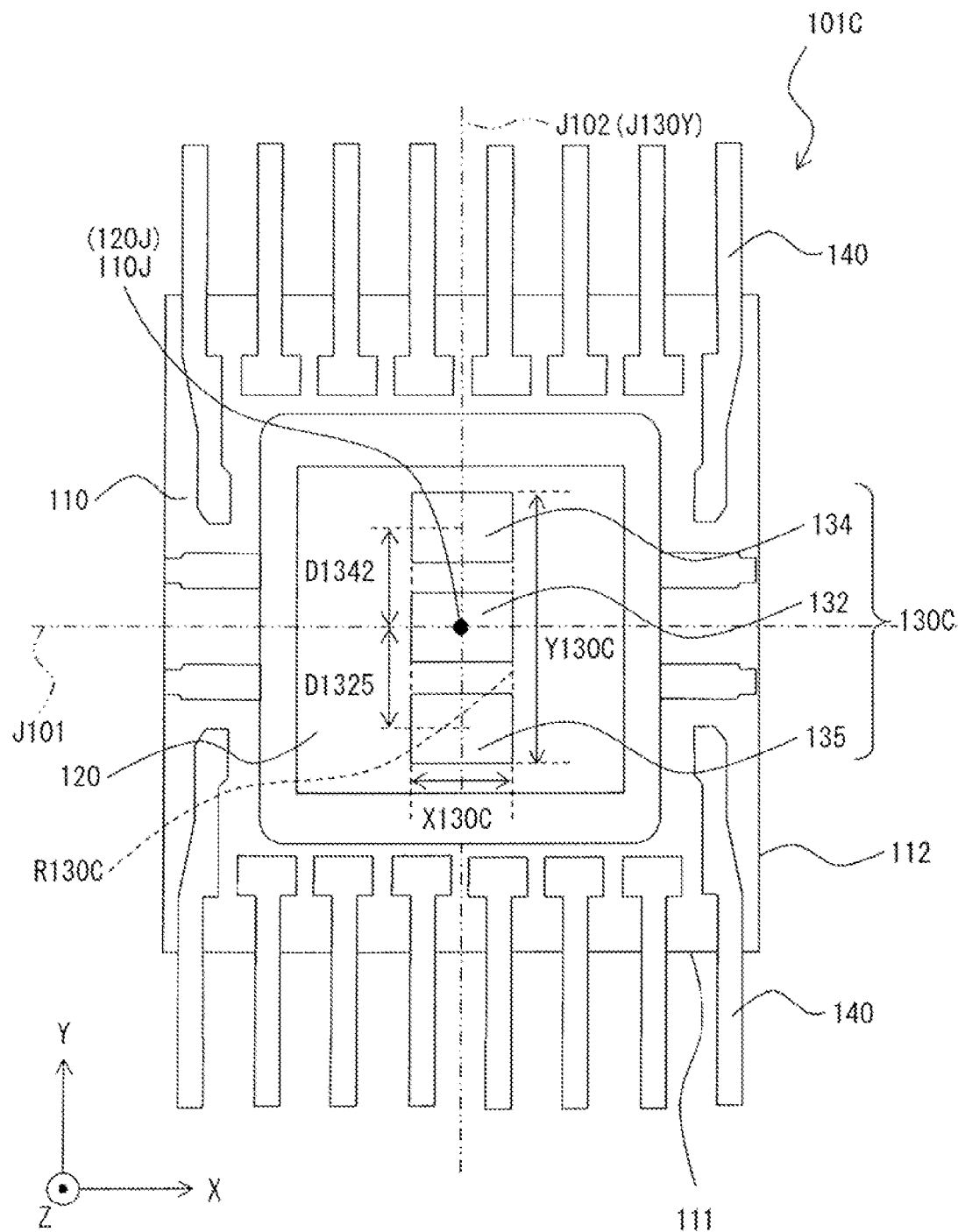
FIG. 22 is a plan view of an overall configuration of a sensor unit according to a second modification example of the third embodiment.

FIG. 22 is a plan view of an example of an overall configuration of a sensor unit 101C according to a second modification example (modification example 3-2) of the present embodiment. In the sensor unit 101A according to the foregoing third embodiment, the plurality of sensors 131 to 133 are arranged on the first axis J101 that is substantially parallel to the direction in which the plurality of leads 140 are arranged (the X-axis direction). In contrast, according to the present modification example, a plurality of sensors 134, 132, and 135 are arranged in order on the second axis J102 that is substantially orthogonal to the direction in which the plurality of leads 140 are arranged (the X-axis direction) and passes through the center position 110J (120J). In other words, the second axis J102 and an axis J130Y that passes through a center position in the X-axis direction of a sensor region R130C are substantially coincident with each other. The sensors 134, 132, and 135 configure a sensor group 130C. Here, the sensor 134 and the sensor 135 may be so disposed as to be symmetric with respect to a line and a point around the sensor 132. In other words, it is desirable that a distance D1342 between the sensor 134 and the sensor 132 and a distance D1325 between the sensor 132 and the sensor 135 be substantially equal to each other. Further, the sensor group 130C configured by the sensors 134, 132, and 135 occupies the sensor region 130C in which the ratio of a size Y130C in a longitudinal direction to a size X130C in a transverse direction is less than 3. Disposing the sensors 134, 132, and 135 in this manner also makes it possible to achieve the improvement in the amplitude ratio of the sensors 134, 132, and 135.

Third Modification Example of Third Embodiment
(Modification Example 3-3)

Figure 23:
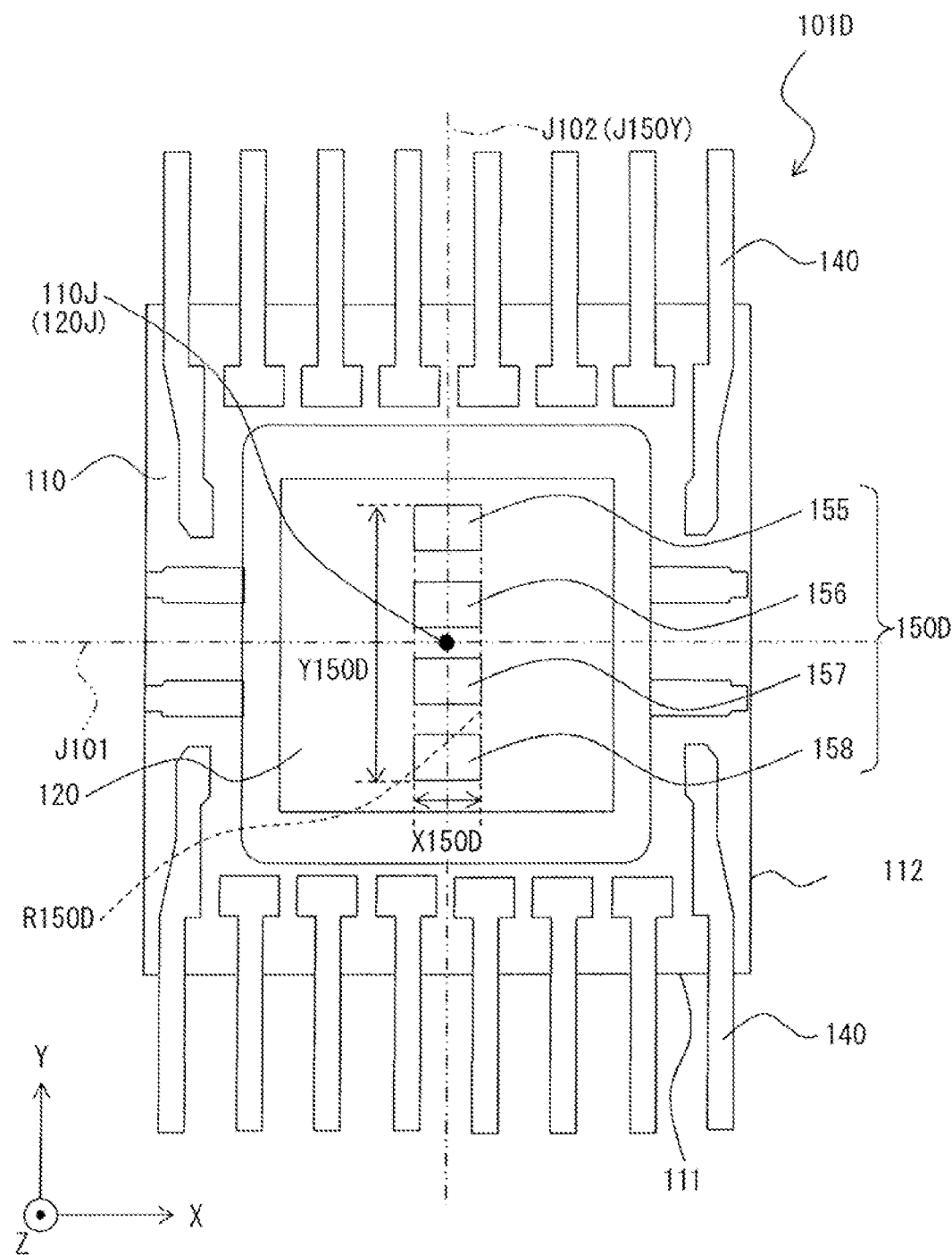
FIG. 23 is a plan view of an overall configuration of a sensor unit according to a third modification example of the third embodiment.

FIG. 23 is a plan view of an example of an overall configuration of a sensor unit 101D according to a third modification example (modification example 3-3) of the present embodiment. For the sensor unit 101C according to the second modification example of the foregoing third embodiment, described is a case where n=3, i.e., a case where the sensor group 130C has the three sensors 134, 132, and 135. In contrast, the sensor unit 101D according to the present modification example has, instead of the sensor group 130C, a sensor group 150D corresponding to n=4, i.e., configured by four sensors 155 to 158. Here, the four sensors 155 to 158 are arrayed in a sensor region R150D in which the ratio of a size Y150D to a size X150D is less than 4. Thus, it is also possible for the present modification example to achieve the improvement in the amplitude ratio of the sensors 155 to 158. Note that an axis J150Y that passes through a center position in the X-axis direction of the sensor region R150D is substantially coincident with the second axis J102.

5. Fourth Embodiment

[Configuration of Sensor Unit 102A]

Figure 24:
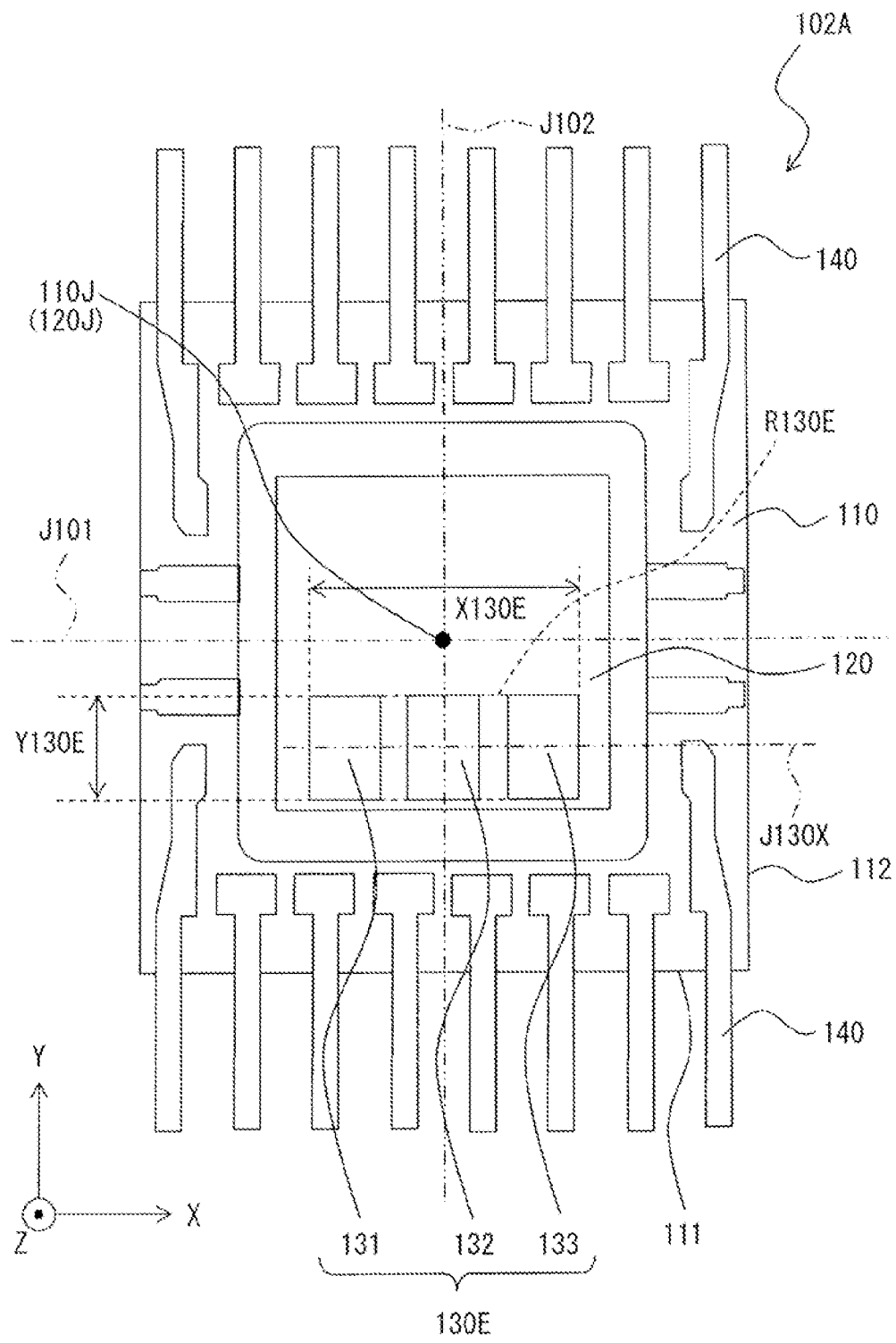
FIG. 24 is a plan view of an overall configuration of a sensor unit according to a fourth embodiment of the invention.

FIG. 24 is a plan view of an example of an overall configuration of a sensor unit 102A according to a fourth embodiment of the invention. The sensor units 101A to 101D according to the foregoing third embodiment are each so configured that the first axis J101 or the second axis J102 that passes through the center position 110J of the substrate 110 is brought into coincidence substantially with the axes J130X and J150X that pass through the respective centers of the sensor regions R130A and R150B, or with the axes J130Y and J150Y that pass through the respective centers of the sensor regions R130C and R150D. In contrast, the sensor unit 102A according to the present embodiment includes a sensor group 130E having the sensors 131 to 133 that are arranged on the axis J130X that is parallel to the first axis J101 but is located at a position different from the first axis J101.

In the sensor unit 102A according to the present embodiment, the three sensors 131 to 133 of the sensor group 130E are arrayed in the sensor region R130E in which the ratio of the size X130E to the size Y130E is less than 3. This makes it also possible for the sensor unit 102A to bring the aspect ratio of the sensor region R130E closer to one as compared with the case where the planar shape of each of the sensors 131 to 133 is square, for example. Hence, it is possible to achieve the improvement in the amplitude ratio of each of the sensors 131 to 133.

Modification Example of Fourth Embodiment
(Modification Example 4-1)

Figure 25:
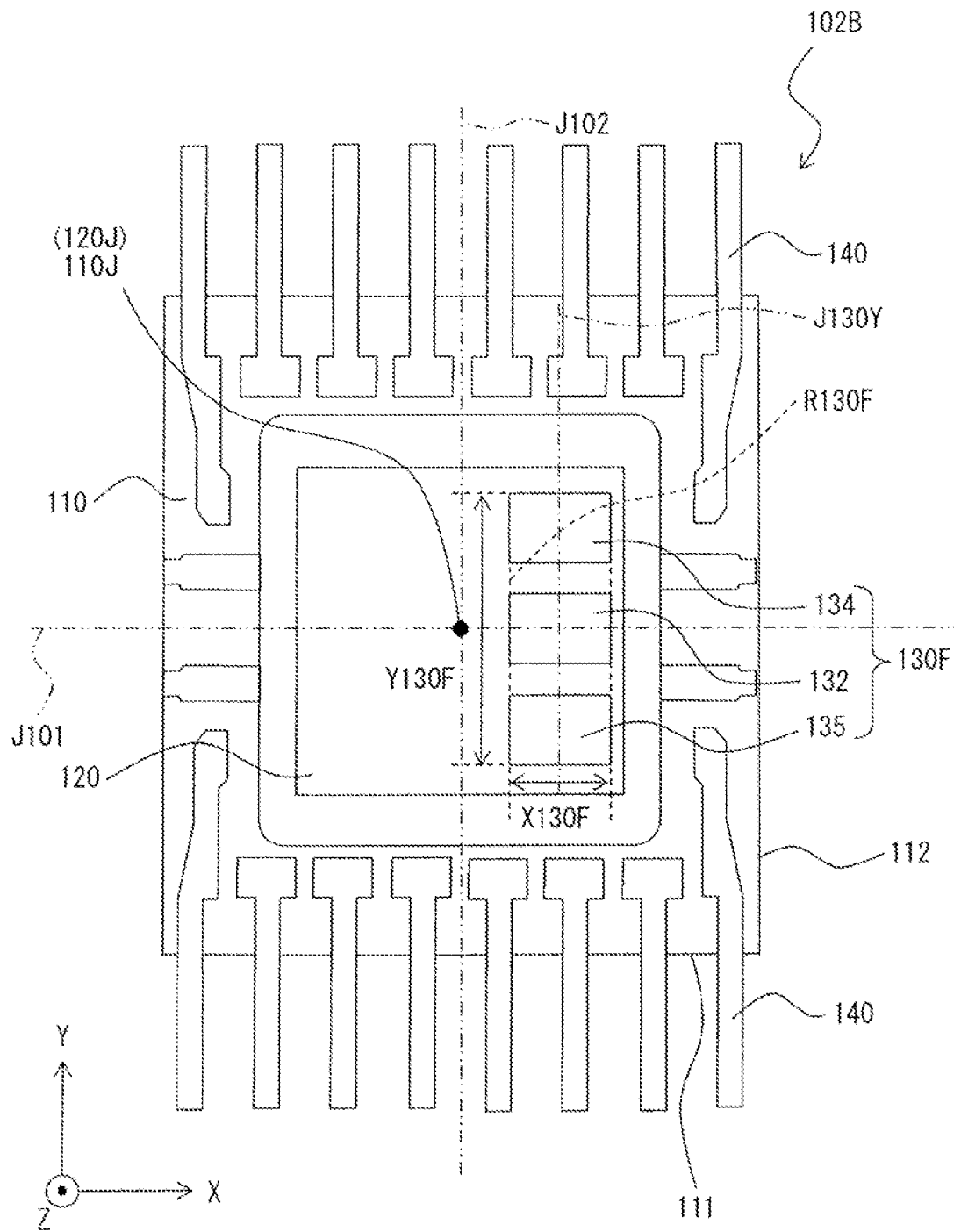
FIG. 25 is a plan view of an overall configuration of a sensor unit according to a first modification example of the fourth embodiment.

FIG. 25 is a plan view of an example of an overall configuration of a sensor unit 102B according to a first modification example (modification example 4-1) of the present embodiment. The present modification example includes a sensor group 130F having the sensors 134, 132, and 135 that are arranged in order on the axis J130Y that is parallel to the second axis J102 but is located at a position different from the second axis J102. Otherwise, the present modification example has a configuration similar to that of the foregoing sensor unit 102A. In other words, in the sensor unit 102B, the three sensors 134, 132, and 135 of the sensor group 130F are arrayed in a sensor region R130F in which the ratio of a size Y130F to a size X130F is less than 3. Disposing the sensors 134, 132, and 135 in this manner also makes it possible to achieve the improvement in the amplitude ratio of the sensors 134, 132, and 135.

6. Second Experimental Example

Samples were fabricated of the respective sensor units 101A to 101D, 102A, and 102B referred to in the foregoing third and fourth embodiments and their modification examples to measure the amplitude ratio (%) and the orthogonality (deg) of each of them. Here, experimental example 101A corresponds to the sensor unit 101A of FIG. 20, experimental example 101B corresponds to the sensor unit 101B of FIG. 21, experimental example 101C corresponds to the sensor unit 101C of FIG. 22, experimental example 101D corresponds to the sensor unit 101D of FIG. 23, experimental example 102A corresponds to the sensor unit 102A of FIG. 24, and experimental example 102B corresponds to the sensor unit 102B of FIG. 25. In these experimental examples 101A to 101D, 102A, and 102B, the planar shape of the substrate 110 was square of 5.0 mm square, and the planar shape of the IC chip was square of 3.5 mm square. Further, in the experimental examples 101A, 101C, 102A, and 102B, the sensor regions R130A, R130C, R130E, and R130F were each 1.6 mm×0.6 mm rectangle, and the planar shape of each of the sensors 131 to 135 was 0.4 mm×0.6 mm rectangle. In the experimental examples 101B and 101D, the sensor regions R150B and R150D were each 2.2 mm×0.6 mm rectangle, and the planar shape of each of the sensors 151 to 158 was 0.4 mm×0.6 mm rectangle.

Figure 27:
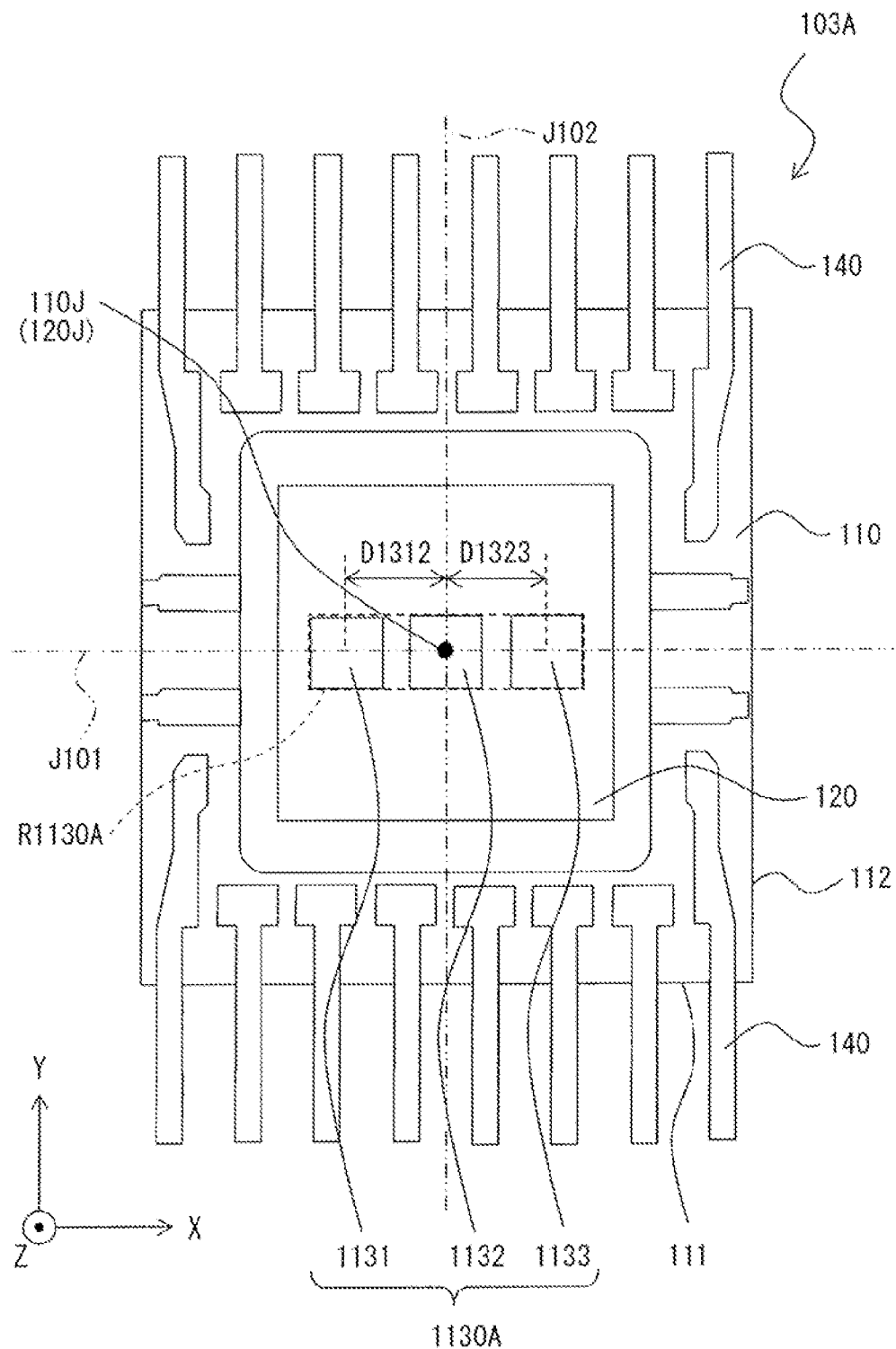
FIG. 27 is a plan view of an overall configuration of a sensor unit according to a fourth reference example.
Figure 28:
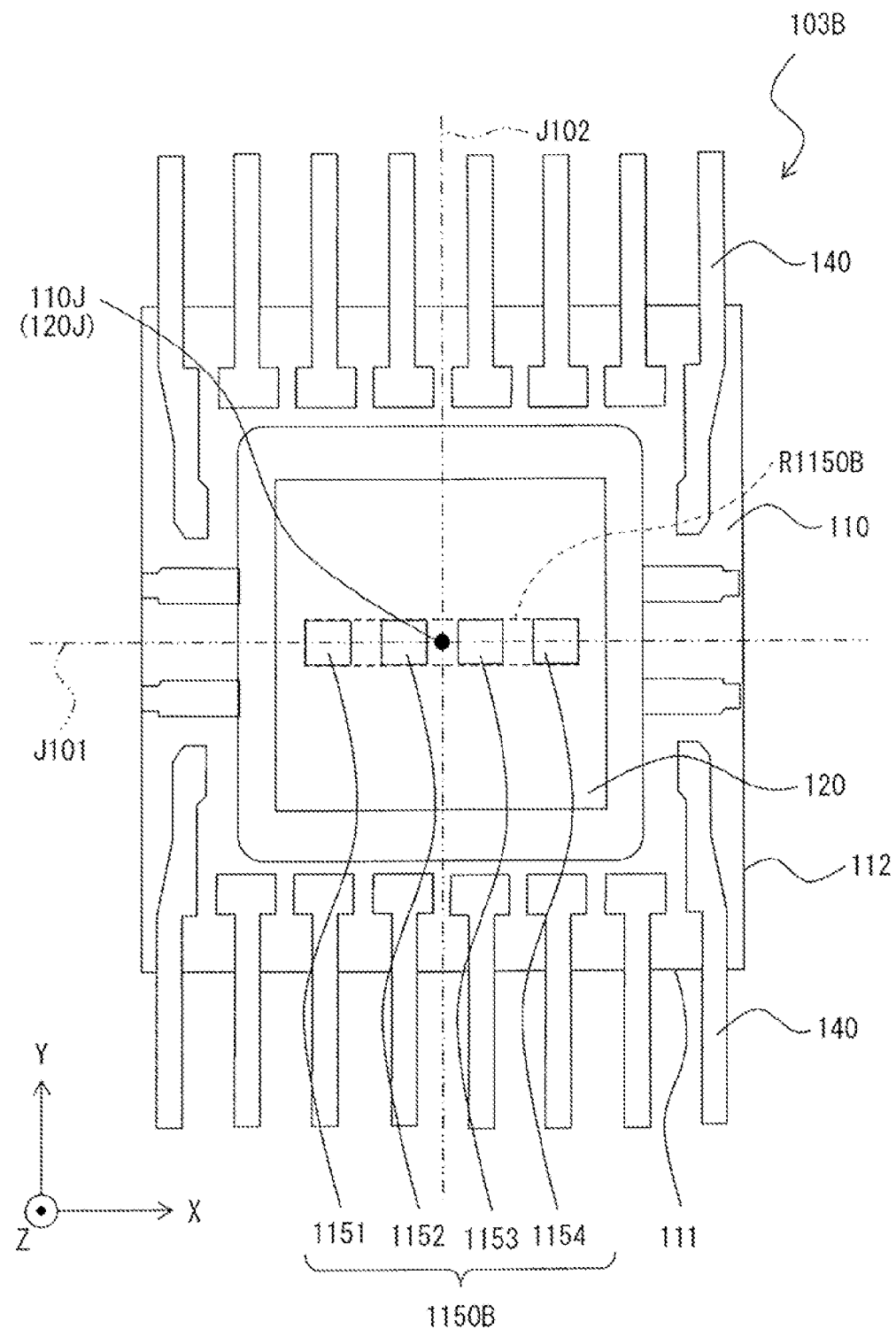
FIG. 28 is a plan view of an overall configuration of a sensor unit according to a fifth reference example.
Figure 29:
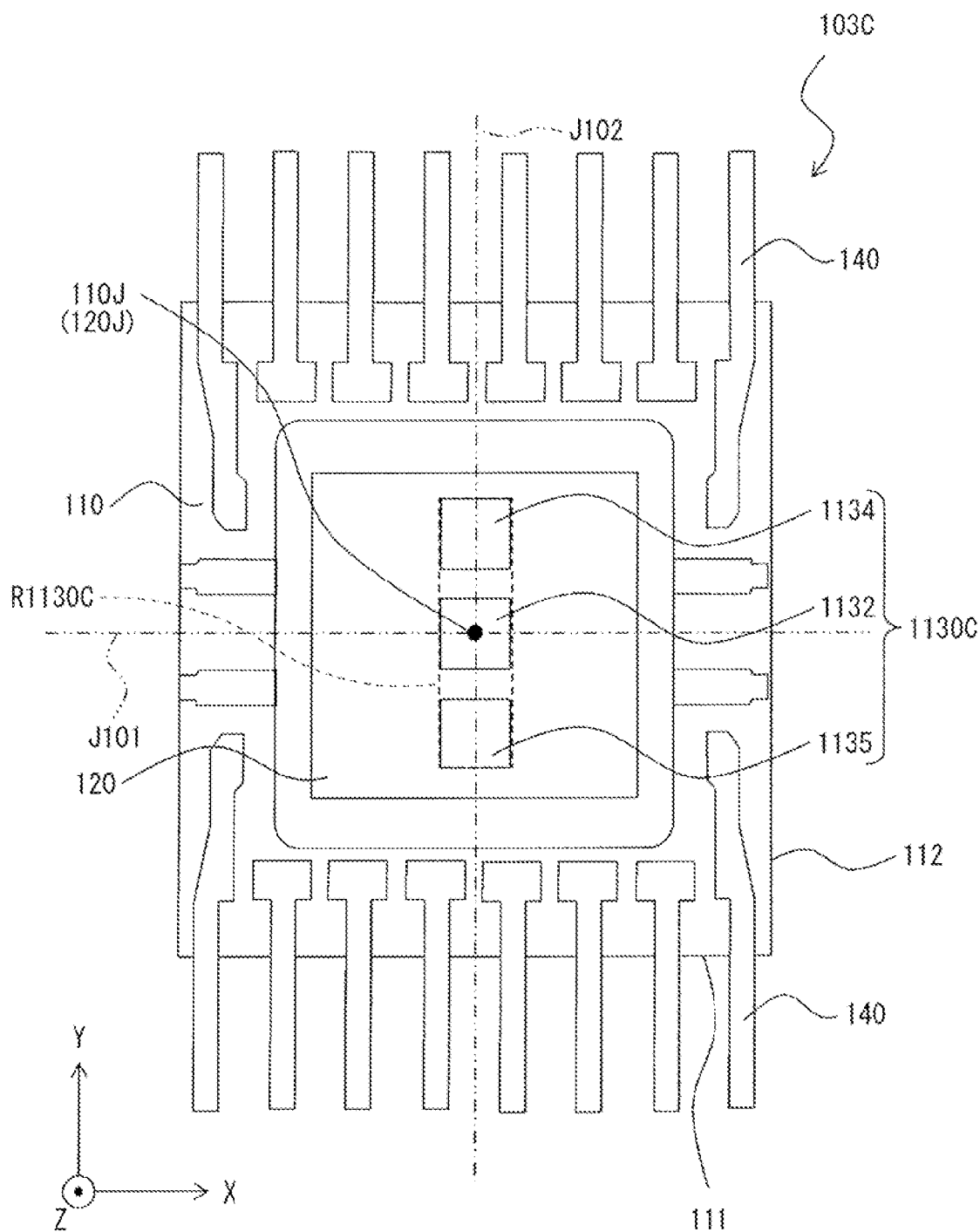
FIG. 29 is a plan view of an overall configuration of a sensor unit according to a sixth reference example.
Figure 30:
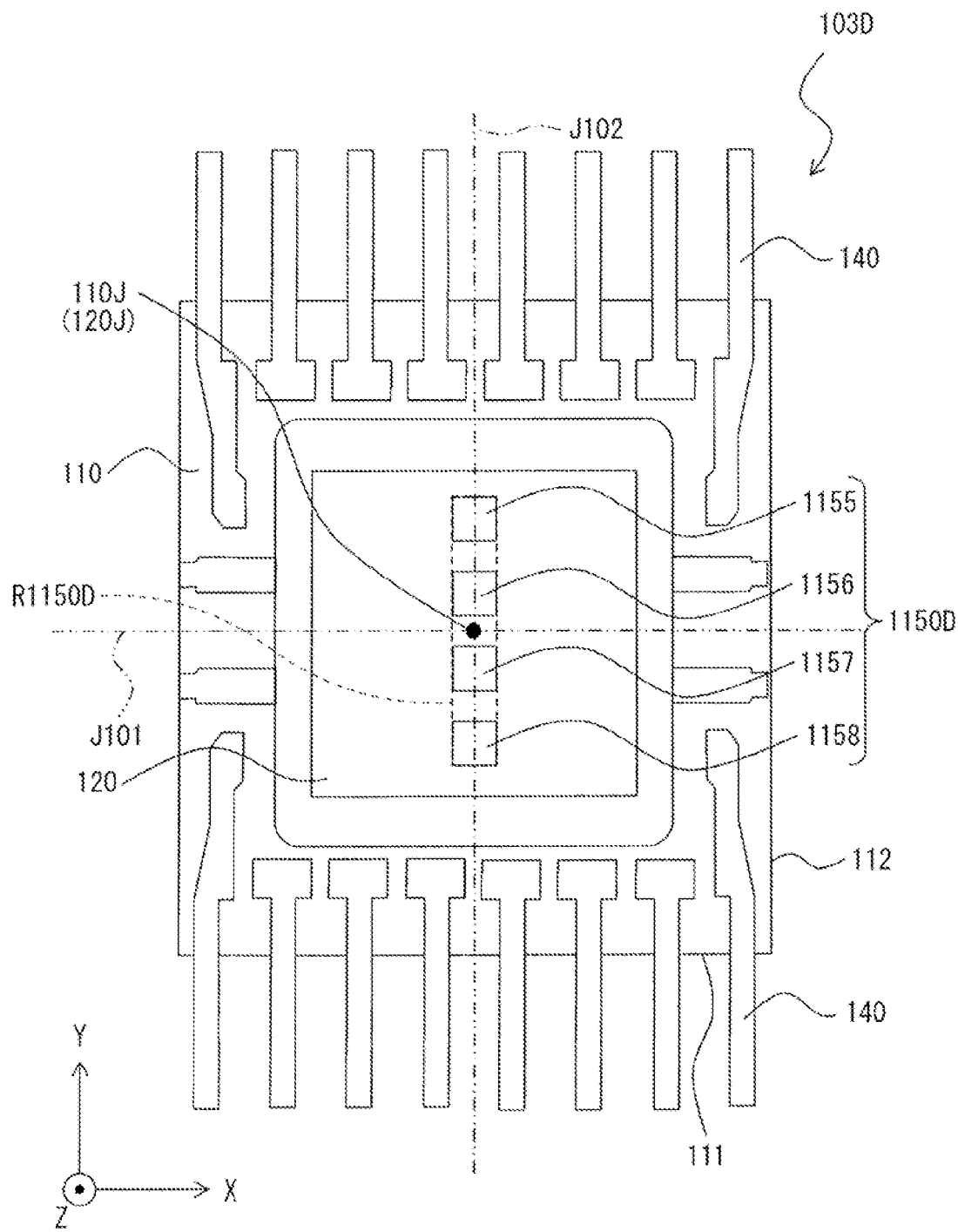
FIG. 30 is a plan view of an overall configuration of a sensor unit according to a seventh reference example.
Figure 31:
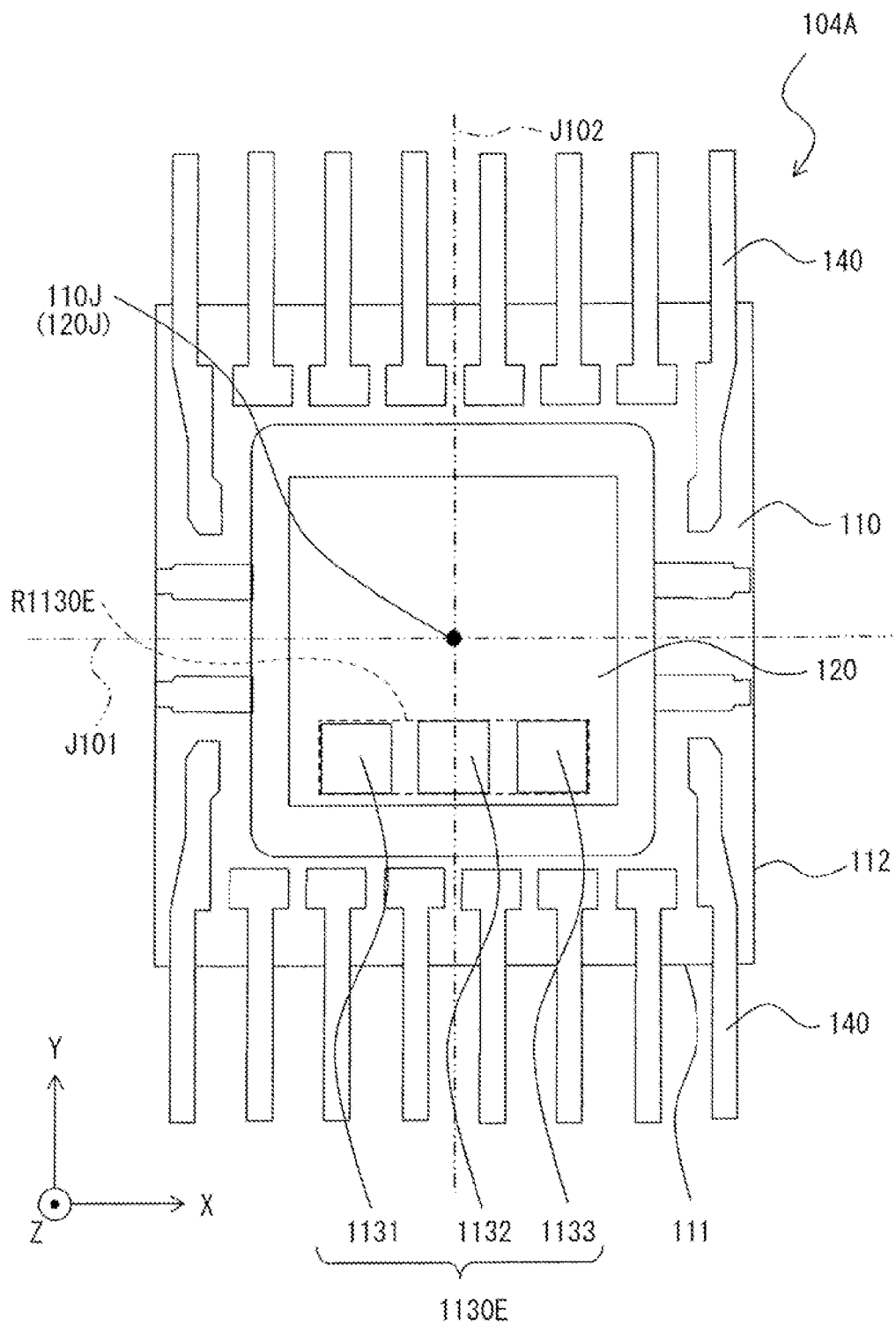
FIG. 31 is a plan view of an overall configuration of a sensor unit according to an eighth reference example.
Figure 32:
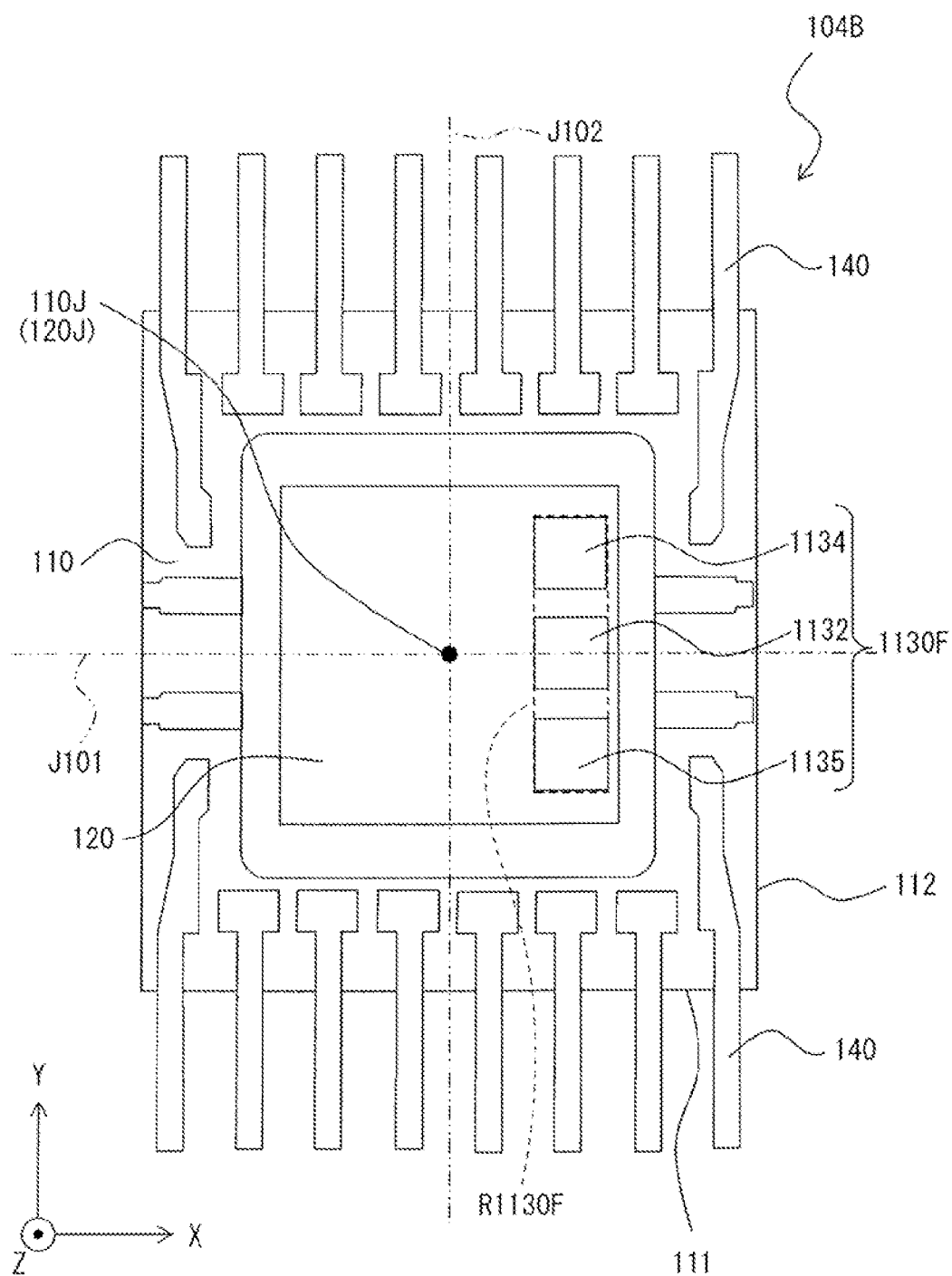
FIG. 32 is a plan view of an overall configuration of a sensor unit according to a ninth reference example.

Further, experimental example 103A corresponds to a sensor unit 103A according to a reference example illustrated in FIG. 27. The sensor unit 103A is similar in configuration to the sensor unit 101A (FIG. 20), with exception that the sensor unit 103A includes, instead of the sensor group 130A, a sensor group 1130A having sensors 1131 to 1133. Similarly, experimental example 103B corresponds to a sensor unit 103B according to a reference example illustrated in FIG. 28. The sensor unit 103B is similar in configuration to the sensor unit 101B (FIG. 21), with exception that the sensor unit 103B includes, instead of the sensor group 150B, a sensor group 1150B having sensors 1151 to 1154. Experimental example 103C corresponds to a sensor unit 103C according to a reference example illustrated in FIG. 29. The sensor unit 103C is similar in configuration to the sensor unit 101C (FIG. 22), with exception that the sensor unit 103C includes, instead of the sensor group 130C, a sensor group 1130C having sensors 1132, 1134, and 1135. Experimental example 103D corresponds to a sensor unit 103D according to a reference example illustrated in FIG. 30. The sensor unit 103D is similar in configuration to the sensor unit 101D (FIG. 23), with exception that the sensor unit 103D includes, instead of the sensor group 150D, a sensor group 1150D having sensors 1155 to 1158. Experimental example 104A corresponds to a sensor unit 104A according to a reference example illustrated in FIG. 31. The sensor unit 104A is similar in configuration to the sensor unit 102A (FIG. 24), with exception that the sensor unit 104A includes, instead of the sensor group 130E, a sensor group 1130E having the sensors 1131 to 1133. Experimental example 104B corresponds to a sensor unit 104B according to a reference example illustrated in FIG. 32. The sensor unit 104B is similar in configuration to the sensor unit 102B (FIG. 25), with exception that the sensor unit 104B includes, instead of the sensor group 130F, a sensor group 1130F having the sensors 1132, 1134, and 1135. Note that, in the experimental examples 103A, 103C, 104A, and 104B, the sensor regions R1130A, R1130C, R1130E, and R1130F were each 1.6 mm×0.4 mm rectangle, and the planar shape of each of the sensors 1131 to 1135 was 0.4 mm×0.4 mm square. In the experimental examples 103B and 103D, the sensor regions R1150B and R1150D were each 2.2 mm×0.4 mm rectangle, and the planar shape of each of the sensors 1151 to 1158 was 0.4 mm×0.4 mm square.

Figure 26:
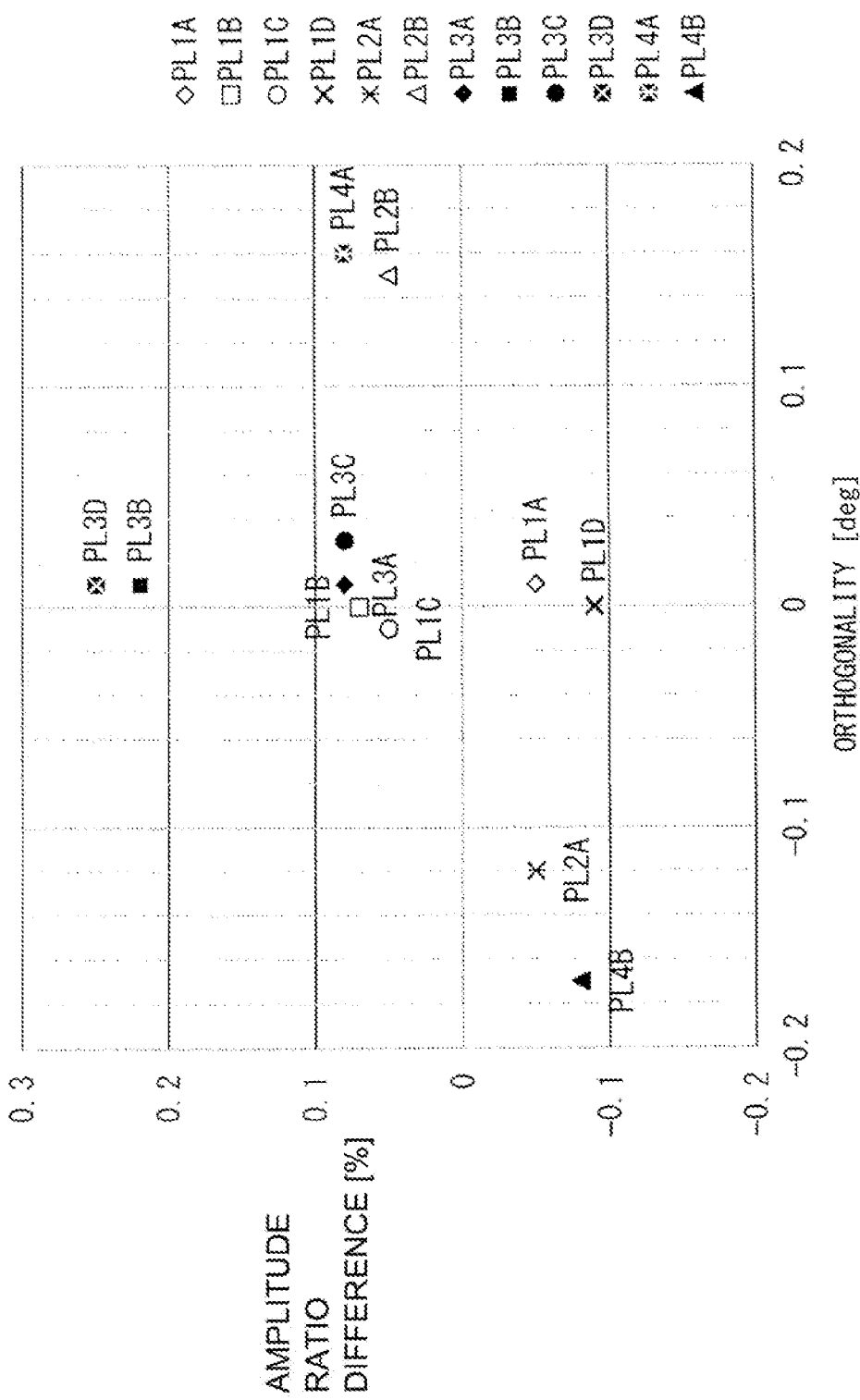
FIG. 26 is a characteristic diagram illustrating characteristic values of sensors according to a second experimental example.

FIG. 26 illustrates a relationship of the orthogonality versus a difference between amplitude ratio before heating of a substrate and amplitude ratio after the heating of the substrate (hereinafter simply referred to as an amplitude ratio difference), for each of the samples. As used herein, the wording "the amplitude ratio after the heating of the substrate" refers to the amplitude ratio measured immediately after causing the substrate 110 to be held at a temperature of 120 degrees centigrade for 24 hours. The amplitude ratio before the heating of the substrate is the amplitude ratio measured at a room temperature (23 degrees centigrade). The closer the amplitude ratio difference is to zero, the more preferable the amplitude ratio difference is. It is most preferable that the amplitude ratio difference be substantially zero. In FIG. 26, a horizontal axis denotes the orthogonality [deg] whereas a vertical axis denotes the amplitude ratio difference [%]. Note that plots corresponding to the respective experimental examples 101A to 101D, 102A, 102B, 103A to 103D, 104A, and 104B are denoted with their respective reference signs PL1A to PL1D, PL2A, PL2B, PL3A to PL3D, PL4A, and PL4B in FIG. 26. In FIG. 26, the experimental example 101A (FIG. 20) illustrates data corresponding to the sensor 133, the experimental example 101B (FIG. 21) illustrates data corresponding to the sensor 154, the experimental example 101C (FIG. 22) illustrates data corresponding to the sensor 135, the experimental example 101D (FIG. 23) illustrates data corresponding to the sensor 158, the experimental example 102A (FIG. 24) illustrates data corresponding to the sensor 133, and the experimental example 102B (FIG. 25) illustrates data corresponding to the sensor 135. Further, in FIG. 26, the experimental example 103A (FIG. 27) illustrates data corresponding to the sensor 1133, the experimental example 103B (FIG. 28) illustrates data corresponding to the sensor 1154, the experimental example 103C (FIG. 29) illustrates data corresponding to the sensor 1135, the experimental example 103D (FIG. 30) illustrates data corresponding to the sensor 1158, the experimental example 104A (FIG. 31) illustrates data corresponding to the sensor 1133, and the experimental example 104B (FIG. 32) illustrates data corresponding to the sensor 1135.

As illustrated in FIG. 26, the experimental examples 101A to 101D, 102A, and 102B (the plots PL1A to PL1D, PL2A, and PL2B) according to the invention showed improvement in the amplitude ratio as compared respectively with the experimental examples 103A to 103D, 104A, and 104B (the plots PL3A to PL3D, PL4A, and PL4B) according to the reference examples.

7. Other Modification Examples

Hereinbefore, although the invention has been described by referring to some embodiments and some modification examples, the invention is not limited to those embodiments, etc., and various modifications may be made. For example, examples have been described in the foregoing embodiments, etc., in which three or four sensors are arranged in the X-axis direction or the Y-axis direction. The number of sensors, however, is not limited thereto in the invention. Any number is selectable for the sensors as long as the number is two or greater. Further, shapes and sizes of the respective sensors to be mounted to a single sensor unit are not limited to a case where they are the same as each other.

In addition, described in the foregoing embodiments, etc., is the sensor unit used as the angle detection sensor used for the detection of the rotation angle of the rotating body. Use of the sensor unit according to the invention, however, is not limited thereto. For example, the sensor unit according to the invention is also applicable to an electronic compass that detects geomagnetism or other applications. Further, the sensor may include a detection device other than the magneto-resistive effect device, such as a Hall device.

It is to be noted that the invention is particularly useful for a case where a tunneling magneto-resistive device (TMR device) having the MTJ film is employed as the magneto-resistive effect device, as compared with a case where a GMR device having the GMR film is employed. A reason is that, in general, the TMR device is higher in sensitivity than the GMR device and is more susceptible to the stress applied to sensors (involves an increase in error more easily).

The present application is based on and claims priority from Japanese Patent Application No. 2016-140085 filed with the Japan Patent Office on Jul. 15, 2016, Japanese Patent Application No. 2016-241461 filed with the Japan Patent Office on Dec. 13, 2016, and Japanese Patent Application No. 2016-000854 filed with the Japan Patent Office on Jan. 6, 2017, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed:

1. A sensor unit comprising:
   a substrate having a substantially-rectangular shape including a pair of first sides and a pair of second sides that are substantially orthogonal to each other;
   a circuit chip stacked on the substrate;
   a plurality of sensors provided on the circuit chip and arranged on an axis, the axis being substantially parallel to the second side and passing through a center position of the circuit chip; and
   a plurality of pads provided on the substrate and arranged along each of pair of first sides.

2. The sensor unit according to claim 1, wherein a center position of the substrate is coincident with a center position of the circuit chip.

3. The sensor unit according to claim 1, wherein
   one of the plurality of sensors is a center position sensor provided at the center position of the circuit chip, and the same number of the remaining sensors, excluding the center position sensor, of the plurality of sensors are provided on either side of the center position sensor to interpose the center position sensor.

4. The sensor unit according to claim 1, wherein
   the plurality of sensors are disposed on the axis with a distance provided therebetween that separates the plurality of sensors mutually.

5. The sensor unit according to claim 1, wherein
   the plurality of sensors have respective rectangular shapes that are substantially equal to each other,
   sizes, along the first side, of the respective sensors are substantially same as each other, and
   sizes, along the second side, of the respective sensors are substantially same as each other.

* * * * *